United States Patent
Luijkx et al.

(10) Patent No.: US 7,030,958 B2
(45) Date of Patent: Apr. 18, 2006

(54) OPTICAL ATTENUATOR DEVICE, RADIATION SYSTEM AND LITHOGRAPHIC APPARATUS THEREWITH AND DEVICE MANUFACTURING METHOD

(75) Inventors: Cornelis Petrus Andreas Marie Luijkx, Best (NL); Vadim Yevgenyevich Banine, Helmond (NL); Hako Botma, Eindhoven (NL); Martinus Van Duijnhoven, Deurne (NL); Markus Franciscus Antonius Eurlings, Tilburg (NL); Heine Melle Mulder, Eindhoven (NL); Johannes Hendrik Everhardus Aldegonda Muijderman, Veldhoven (NL); Cornelis Jacobus Van Duijn, Best (NL); Jan Jaap Krikke, Best (NL)

(73) Assignee: ASML Netherlands B.V., Veldhoven (NL)

( * ) Notice: Subject to any disclaimer, the term of this patent is extended or adjusted under 35 U.S.C. 154(b) by 24 days.

(21) Appl. No.: 10/748,849

(22) Filed: Dec. 31, 2003

(65) Prior Publication Data

US 2005/0140957 A1    Jun. 30, 2005

(51) Int. Cl.
*G03B 27/52* (2006.01)

(52) U.S. Cl. ............... 355/30; 355/53; 355/67; 355/69; 355/71

(58) Field of Classification Search ............ 355/53, 355/67–71; 250/492.1, 492.2; 356/400, 356/401; 378/34
See application file for complete search history.

(56) References Cited

U.S. PATENT DOCUMENTS

| 4,778,263 | A |   | 10/1988 | Foltyn et al. |
| 4,837,794 | A | * | 6/1989 | Riordan et al. ............... 378/34 |
| 6,404,499 | B1 | * | 6/2002 | Stoeldraijer et al. ... 250/492.22 |
| 6,704,090 | B1 | * | 3/2004 | Nishi ........................ 355/53 |
| 2003/0063266 | A1 |   | 4/2003 | Leenders et al. |

FOREIGN PATENT DOCUMENTS

| EP | 0 952 491 A2 | 10/1999 |
| EP | 0 952 491 A3 | 10/1999 |
| EP | 1 349 009 A2 | 10/2003 |
| EP | 1 349 009 A3 | 10/2003 |

OTHER PUBLICATIONS

European Search Report for Application No.: EP 04 07 8467, completed Jun. 3, 2005.

* cited by examiner

*Primary Examiner*—D. Rutledge
(74) *Attorney, Agent, or Firm*—Pillsbury Winthrop Shaw Pittman, LLP

(57) ABSTRACT

An optical attenuator device operates to remove a part of a beam of radiation having a higher than average intensity using at least one optical attenuator element. The device has application in a radiation system, and/or a lithographic apparatus, in particular a scanning lithographic apparatus, wherein the optical attenuator element(s) are provided in a central part of the beam, for example perpendicularly to a scanning direction.

47 Claims, 12 Drawing Sheets

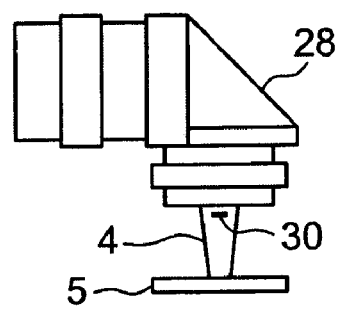
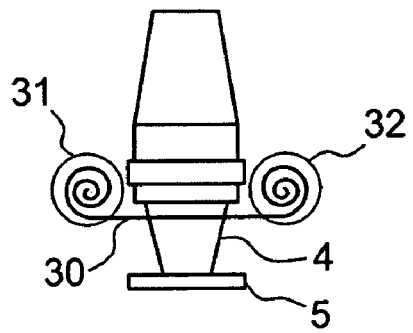
FIG. 4a              FIG. 4b
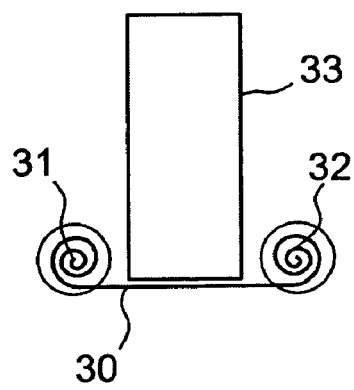
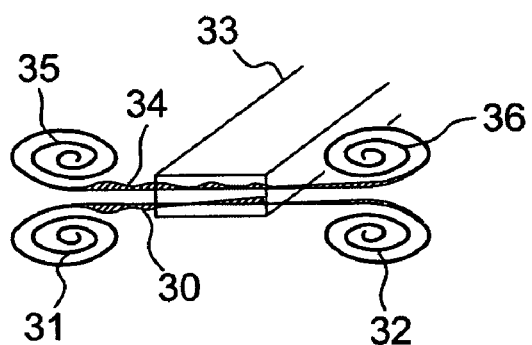
FIG. 5a              FIG. 5b
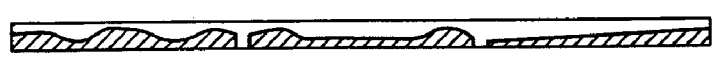
FIG. 6

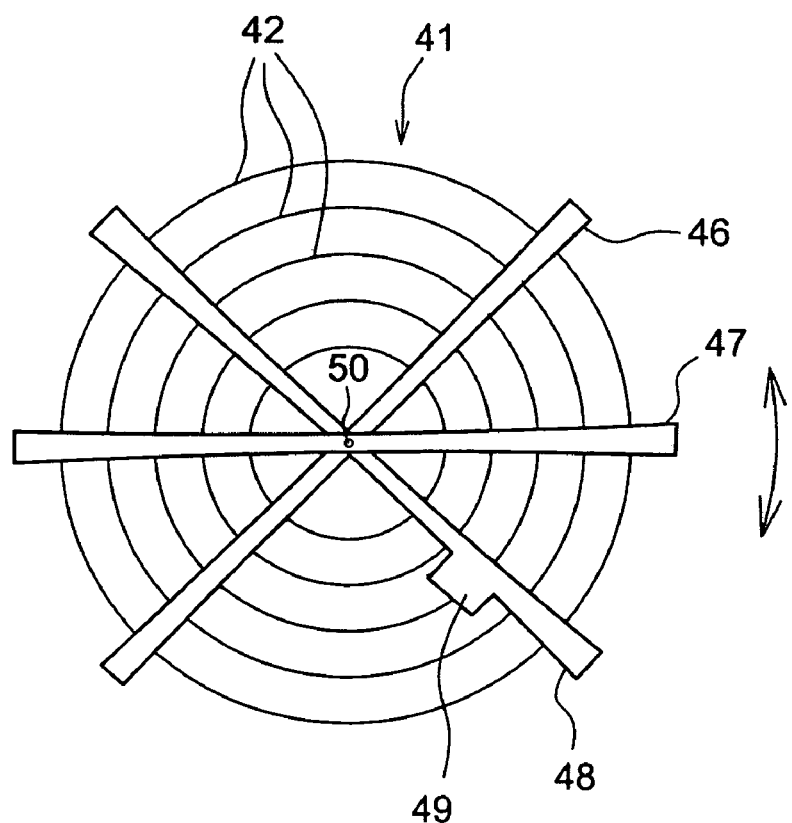
FIG. 8
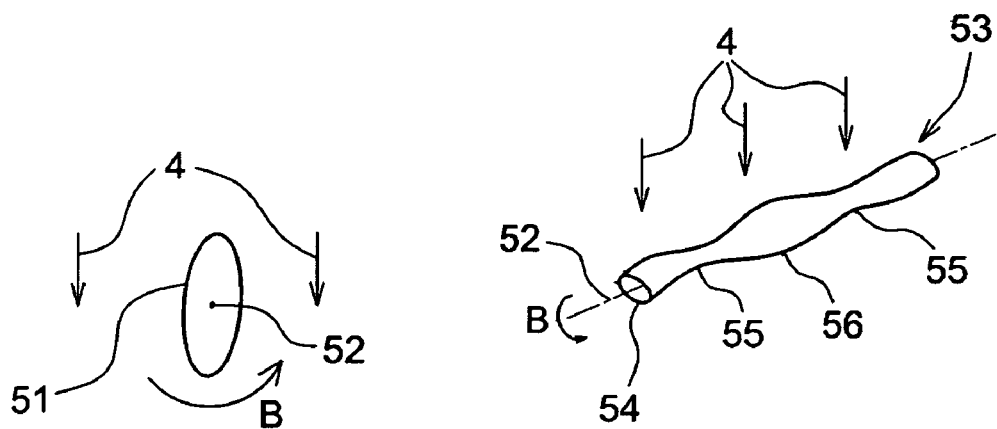
FIG. 9
FIG. 10

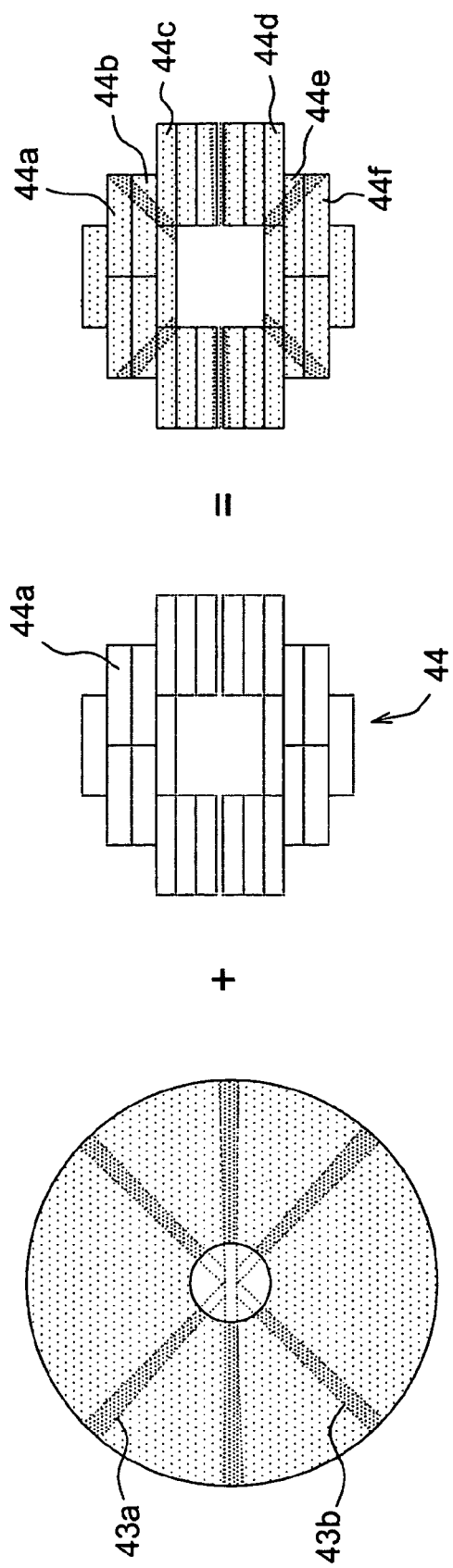

OPTICAL ATTENUATOR DEVICE, RADIATION SYSTEM AND LITHOGRAPHIC APPARATUS THEREWITH AND DEVICE MANUFACTURING METHOD

BACKGROUND OF THE INVENTION

Field of the Invention

The present invention relates generally to an optical attenuator device for improving a homogeneity of a beam of radiation and more particularly for use of such a device in a lithographic apparatus.

SUMMARY OF THE INVENTION

One aspect of embodiments of the present invention includes an optical attenuator device for improving a homogeneity of a beam of radiation for use in a lithographic apparatus, said optical attenuator device including at least one optical attenuator element which removes a part of said radiation from said beam of radiation. By removing a part of the radiation from the beam of radiation, in particular from a beam part having a higher local intensity than an average intensity of the beam of radiation, the homogeneity of the total beam of radiation will be improved, with beneficial effects on exposure, uniformity of features (line thickness etc.). Here, as in the rest of the application, the term optical (radiation) relates to a range of wavelengths of any radiation used, such as electromagnetic radiation including EUV and DUV, as well as visible radiation. The terms "uniformity" and "homogeneity" are used interchangeably herein.

In certain embodiments, the at least one optical attenuator element is movable such that a cross-sectional area as presented to the beam is modifiable and at the same time a 3-dimensional shape of said optical attenuator element remains mirror symmetrical with respect to a line parallel to a propagation direction of the beam of radiation. In particular, said propagation direction is taken as an optical axis of symmetry of the beam of radiation, while said line intersects the common edge in the center thereof. However, said line may intersect the optical attenuator element in a different point of the common edge. Herein, the at least one optical attenuator element may extend in a direction perpendicular to a scanning direction, when the optical attenuator device is used in a scanning lithographic apparatus.

This embodiment offers the possibility of changing the amount of radiation that is taken out of the beam, e.g., by increasing the cross-sectional area of the optical attenuator element(s) as seen by the beam of radiation, while at the same time an angular dependent attenuation of the beam of radiation is avoided.

U.S. Application Publication No. 2003/0063266 A1 appears to describe an intensity adjustment device, comprising rotatable blades. However, when such blades are rotated in a beam that consists of rays that are not all strictly parallel, as is the case in any real projection beam, the rotation will introduce a different angular intensity distribution on both sides of the blades. In many practical situation, targets to be illuminated by the beam, such as patterning devices in a lithographic apparatus, may be placed in a focal plane of the beam (field plane). This means that the angular intensity distribution will change when travelling in the direction of the beam towards the field plane. A rotatable blade may then block a certain first part of the beam on one side of the blade, and a certain second part on the other side of the blade. The first and second part are situated at different distances from the field plane, and hence may be attenuated differently. This is to be avoided, and the present embodiment does this by providing a symmetrically movable attenuator element.

Such optical attenuator elements may be provided in a central part of the beam. Herein, it is to be understood that this situation relates to a use of the optical attenuator device in a beam of radiation, notably in a beam of radiation in a lithographic projection apparatus. The term "central part" is meant to indicate that part of the beam, as seen in a plane perpendicular to the beam, in which there is a substantially symmetrical angular intensity distribution. That is to say, when one takes a point in a plane illuminated by the beam of radiation, in particular a field plane at an illuminated object, then the collection of rays travelling towards that point should form a distribution which is point symmetrical with respect to the direction of the beam as a whole. Hence the angular light distribution in a plane is symmetrical: every direction and its mirrored counterpart provide an equal amount of radiation. Note that, away from the field plane, towards the edges of the beam of radiation there will be certain directions that are not able to provide radiation, the extreme case being the edge itself. This is due to the fact that there are only contributions from the side of the beam. In the central part, there is an overlap of cones from all directions, such that the angular distribution is substantially the same at every point. It also follows that it is not necessary for the optical attenuator to be present in the geometrical center of the beam, since in a (central) part of the beam the cone will generally be filled substantially to a maximum, which depends in part on the numerical aperture of the optical system. It is this part which may be attenuated by the optical attenuator(s), although it is not strictly necessary.

By providing an optical attenuator element such that it removes a part of the radiation in a central part of said beam, the quality of the beam will not be severely deteriorated as to aspects such as telecentricity and ellipticity. This is based on a position of the optical attenuator element in the central part of said beam, or at least not in a "wing" or "ramp" of the beam, in which the angular distribution of radiation is not fully developed. Note that this situation holds especially in the case of a scanning lithographic apparatus, in which illumination of a target portion of a surface to be illuminated takes place in a scanning direction which makes an angle with the central line, preferably a right angle. In this case the beam of radiation sweeps across the surface to be illuminated. As long as the integrated intensity of all of the beam that illuminates a certain point of the surface to be illuminated has a full and regular angular distribution, relatively little telecentricity versation, for example, will occur. This distribution is itself a combination of the distributions that arise from every part of the beam that participates in the illumination. Now, when the optical attenuator element takes away some radiation from a beam part in an edge of the intensity distribution, a correct integrated intensity distribution is not very likely, while when radiation is taken away from the central part, the optical attenuator element automatically takes away a first part from a first angular distribution as well as its mirrored counterpart, such that overall the integrated angular distribution will not change. The consideration that the presence of the optical attenuator element in the central part of the beam of radiation is advantageous for a scanning lithographic apparatus holds in principle for every combination of such a scanning lithographic apparatus with such an optical attenuator element.

Often, the central part is located around a line of symmetry, and in particular an axis of symmetry in a direction of the largest cross sectional dimension of the beam, or a line dividing the beam, in particular the cross section of the beam, in two parts having an equal shape. Though symmetry is advantageous in preventing possible inhomogeneities, it would in principle suffice for the optical attenuator element to be present in the central part. In the following, wherever the term "central line" is used, it is to be understood that "central part" is to be included. Likewise, the term "is symmetrical with respect to the central line" and its equivalents comprise "is symmetrical with respect to a line in the central part" as described above. Note that the line need not be a straight line, especially in cases in which the beam has a non-rectangular shape. For example, in certain lithographic apparatus, the cross-section of the beam of radiation is more or less arc-shaped, and the central line is a curved line dividing the arc in two halves along its length.

The considerations of the optical attenuator element or elements being symmetrical with respect to a central line, and being present in a central part hold throughout the present application.

In an advantageous embodiment, at least one optical attenuator element comprises at least two sheets having edges, said sheets being connected to each other at a common edge, and the optical attenuator device comprises a sheets actuator for moving at least one of said sheets with respect to another of said sheets, around an axis formed by said common edge.

Preferably but not exclusively, such sheets are substantially flat. Although it is not necessary that the optical attenuator element comprises an element which is flat, a flat element generally has the property that, when it is arranged extending in a plane parallel to the beam of radiation, it provides only a small cross-sectional area. When the homogeneity of the beam cannot or need not be improved by the optical attenuator element, then an element which is flat need not be removed from the beam, as it will allow most of the radiation to pass unimpededly.

In one embodiment, an axis for rotating the sheets extends perpendicularly to the direction of the beam of radiation, in order to change a cross-sectional area of the sheets efficiently. Preferably, the axis also extends parallel to or perpendicularly to a central line of said beam of radiation. This allows the sheets to remove a part of the radiation from the beam of radiation in a symmetrical fashion. The sheets may have a rectangular shape. By arranging such sheets in a symmetrical fashion with respect to the beam, a very symmetrical influence may be exerted on the intensity and homogeneity of the beam of radiation.

This embodiment generally has the property that the removal of a part of said radiation of said beam of radiation can be performed highly symmetrically, in particular when said sheets are moved, and advantageously rotated, in a mirror-like fashion around said axis. In other words, one of the sheets is rotated, while the other is counterrotated.

Although it is conceivable to have more than two sheets, connected at a common edge, it is sufficient to have two sheets because this is the simplest way to achieve symmetry. Moreover, in many cases, any third, fourth, etc. sheet would only screen radiation from a first or second sheet, without adding much influence on the beam as a whole.

Said arrangement of two sheets connected at a common edge may be obtained by folding one large sheet in two, such that the two halves of the large sheet come to over-lie each other. However, any other method of providing such an arrangement is also possible, for example gluing, welding, or otherwise fastening two sheets together.

The sheets' actuator may comprise for example a simple motor, such as an electromotor together with a transmission for transmitting the movement of the electromotor to the sheets. The transmission may for example be a shaft connected with both the sheets actuator and the sheets.

It is specifically noted that the term "moving" at least one of said sheets not only comprises a movement in which the shape of said sheet or said sheets does not change, such as a simple rotation. It is also possible to move at least one sheet by changing the shape of said sheet, e.g., by bending etc., said sheet. In this context, the phrase "around an axis formed by said common edge" indicates that the projection of said sheet on a plane perpendicular to said axis remains substantially a curve, having substantially zero area. In other words, every tangent plane to said sheet remains substantially parallel with said axis.

Advantageously, the at least two sheets comprise an electrically conducting material, and the actuator comprises a current source connected to the electrically conducting material, for charging the electrically conducting material. This embodiment provides a method for moving the sheets substantially without any mechanically moving parts. The actuator is based on electrical repulsion of equally charged parts. Herein, a material is considered to be electrically conducting when it has a specific conductivity higher than 0.01%, and preferably higher than 1% of the conductivity of copper. Most metals and alloys satisfy this requirement. Said sheets may comprise foils of metal or metal alloy, or foils of an other material, e.g., a plastic, which is covered with an electrically conducting material. The sheet need not consist entirely of, or be completely covered by, an electrically conducting material, although this may have the advantage of a more precisely controllable movement of the sheet.

In another embodiment of the optical attenuator device according to the invention, at least one optical attenuator element comprises a ribbon or wire having a width profile which varies over the length of said ribbon or wire. Said ribbon is, for example, arranged such that it extends in a plane formed by the direction of the beam of radiation and the central line of a cross-section of said beam. In other words, a side of the ribbon is presented to the beam, which means that a smallest cross-sectional area of the ribbon is offered to influence the beam of radiation. This has the advantage of having a small cross-sectional area, yet a relatively large amount of material, which imparts rigidity to the optical attenuator element. In the case of the optical attenuator element being a wire, it is advantageous when the wire is rotationally symmetric, which means that a rotation or rotational deformation of the wire does not present a different cross-sectional area. This means that substantially always the same amount of radiation is removed from said beam of radiation.

U.S. Application Publication No. 2003/0063266 A1 appears to disclose an intensity correction device for a scanning lithographic apparatus, comprising a number of wires that extend parallel to the scanning direction and that are movable in the direction perpendicular to the scanning direction. Wires that extend parallel to the scanning direction cannot generally be used in or near a filed plane, as this would lead to a total block of radiation at the position of those wires since no part of the beam would contribute any radiation. Only by placing the wires out of focus, i.e., out of the field plane, dark spots are prevented. This, however, allows a less precise local control of homogeneity correction. By using a wire, ribbon, or in general an optical attenuator element that extends in a central part, it becomes possible to locate the element in a field plane, since there are radiation contributions from the "left" and/or the "right" of the element. This allows a more precise local control of the homogeneity correction, since there are no penumbras of the optical attenuator element to be taken into account. This latter consideration holds generally for every optical attenuator element located in a central part of the beam, and for a number of other embodiments.

In another embodiment, the ribbon extends substantially in a plane perpendicular to the beam of radiation. This offers the possibility of using a very flat optical attenuator element, which may be preferable if there is very little space available, or if the limits on dimension would either severely limit the physical strength of the ribbon. E.g., in practice, in a number of lithographic apparatus, there is only about 0.75 mm space available, with beam dimensions of 10×30 mm. In order to have up to 10% attenuation, the ribbon or wire should be up to 1 mm wide. Since this dimension is larger than the available space in the perpendicular direction, the ribbon will extend in the plane perpendicular to the beam of radiation, allowing a thickness of much less than the available 0.75 mm.

In certain embodiments, the ribbon or wire has a length which is at least two times as long as a portion of the ribbon or wire which is present in the beam of radiation, and the ribbon or wire is movable with respect to the beam by means of a ribbon actuator, a wire actuator respectively. This generally has the property that, by moving said ribbon or wire along its length, a different part thereof, having a different thickness profile, may be arranged in the beam of radiation. In this way, a different part, e.g., a different amount, of radiation may be removed from the beam of radiation. This allows a greater flexibility of the system by being able to modify various intensity profiles of beams of radiation.

In an another embodiment the ribbon or wire is wound on two reels, and the optical attenuator device further includes a reel drive for moving the ribbon or wire with respect to the beam. By providing two reels and a reel drive for moving the ribbon or wire with respect to the reels, a method is provided for varying the presented width profile, i.e., the influence on the homogeneity of the beam of radiation. In particular, the ribbon and/or wire is selected to be flexible, such that it may be wound on a reel. The two reels and the reel drive may be constructed like corresponding parts of a tape recorder, although other embodiments thereof are not excluded.

The reel drive may include one or two motors, although any other number is also possible. An aspect of the embodiment with one or two motors is the relatively simple construction which still allows easy provision of many different correction profiles.

The embodiment with a ribbon or wire is useful in various kinds of optical attenuator devices because of its compactness. More precisely, it only requires very little space for the ribbon or wire itself, while reels, motors therefor, etc. may be located away from that location, where there is more space available. In particular, for radiation systems in which the source comprises a substrate of transmissive material, such as a quartz rod in DUV and UV systems, the one or more ribbons and/or wires may be located in the often narrow space between an exit surface of the substrate of transmissive material and any part which is present thereafter. Other possible locations include intermediate planes in the beam, such as for example at the level of conventional uniformity correction modules, the function of which may be enhanced or replaced by the presence of the present embodiment, or for example near a patterning device, i.e., within say 1 cm of a means to impart a patterned intensity distribution to the projection beam of radiation.

It may be useful to be able to correct an intensity by up to 10%, and in particular, in practical cases, by up to 1.5%. This may be achieved by using a ribbon or wire having a maximum thickness/width, as seen in the direction of the beam of radiation, of 10%, or more particularly, up to 1.5%, of the dimension of the beam in the direction perpendicular to the extension of the ribbon or wire. When the ribbon/wire is located immediately under a quartz rod (integrator) of dimensions 10×31 mm, wherein the scanning direction is perpendicular to the longest of these two dimensions, an effective thickness as seen by the beam of 0.15 mm will suffice to provide the required 1.5% attenuation. Note that the direction of extension of the ribbon or wire will generally be perpendicular to the scanning direction, as applied in a scanning lithographic apparatus. This will be elucidated further below.

The effective thickness/width as mentioned in the previous paragraph may be obtained by a wire with a circularly symmetric cross-section, or with a ribbon with a width or cross-section equal to the desired profile. In this latter case, the ribbon may be provided such that it extends in a plane parallel with the beam of radiation, in which case it can have any desired width. It is however also possible, and preferred for compactness, to use a ribbon which extends in a plane perpendicular to the beam. In this case it is either possible to use a very narrow ribbon, the width being determined by the local profile, or it is possible to use a ribbon which comprises a transmissive carrier material and a non-transmissive part, the width of the non-transmissive part corresponding to the desired correction profile.

A possible material for the ribbon or wire is metal. This is not only a strong material, showing a high absorption of radiation, if necessary after appropriate treatment, but it is also able to withstand high temperatures. This is a useful property since absorption of often high intensity radiation will raise the temperature of the ribbon or wire to rather high values. Nevertheless, other materials with comparable properties are conceivable as well including ceramics, plastics and dielectrics. Furthermore, to avoid a high thermal load, it is advantageous to arrange the ribbon/wire in a position where the beam has been expanded to a larger dimension, i.e., a lower intensity.

The ribbon or wire may be of any length, if the beam has a length of N mm, then the length of the ribbon or wire is at least 2 N mm, but may be at least 5 N mm, and in a particular embodiment, at least 10 N mm. A longer length allows the presence of more thickness profiles, although it will take longer for the reel drive to arrange the desired thickness profile in the beam of radiation.

In one embodiment, at least two of the optical attenuator elements are arranged in the beam of radiation, side by side or in parallel planes, as seen in the direction of the beam of radiation. In this way, it is possible to provide a very large number of different combinations of intensity profiles, for correcting a corresponding number of intensity profiles of the beam of radiation, with a limited number of parts, i.e., ribbons/wires and reel drives. One of the ribbons or wires has at least one part of its length which has a thickness/width profile which varies symmetrically over said part of said length, while at least one other ribbon or wire has at least one part of its length which has a thickness/width profile which increases linearly over part of its length. This combination of thickness/width profiles allows a correction, at the same time, of a symmetrical but inhomogeneous intensity profile of the beam together with a linearly increasing intensity, which is often caused by a tilt in the radiation system. Preferably, each of the ribbons or wires comprises a number of parts with such symmetrical thickness/width profiles, linearly increasing thickness/width profiles respectively.

In another embodiment of the invention, the optical attenuator device comprises a first mirror and a second mirror and a slit mirror actuator, wherein a slit is present between the first and second mirror, wherein at least one of the first and second mirror is movable with respect to the beam of radiation by means of a slit mirror actuator, such as to allow the slit to have a variable width as seen by the beam of radiation. This embodiment allows a part of the radiation of the beam of radiation to be removed by not reflecting said part of the radiation. This has certain advantages, in that it becomes possible to provide control to influence the amount of removed radiation, without removing radiation, because they may be arranged behind the mirrors, for example. Note that the extra reflection from this mirror should be taken into account in the design of the total apparatus in which this optical attenuator device is to be used.

Such an optical attenuator element may be applied in an EUV radiation system, since there will almost always be at least one mirror present for guiding the beam of radiation. However, in other systems, such as DUV radiation systems, such an optical attenuator element with a mirror may also be provided. In principle, a mirror itself will not influence the properties of the beam, apart from absorbing an (often very small) amount of the radiation. Note that it is possible that the mirrors are curved, in which case the mirror is capable of bundling the radiation. This may be useful in, e.g., EUV systems, because for EUV radiation the mirrors show losses of up to 30% at each reflection. By concentrating the radiation this loss may be compensated. In the case of curved mirrors the term "plane" as used above should be extended to include curved surfaces as well. A movement of a curved surface should also include a curvilinear motion, notably in a curved surface of which the mirror surface forms a part.

The slit as present between the first and second mirror, may have any width, also a zero width. This is the case when the first and second mirror are adjacent and in the same plane, for example when no intensity correction is required.

In certain embodiments the mirrors may be made up of a plurality of part mirrors, which are movable with respect to the slit by means of an actuator. Both the first and/or second mirrors may be composite mirrors, each comprising a plurality of part mirrors, preferably adjacent. There may be slits present between each individual part mirror and a mirror or part mirror on the opposite side of a central part of the beam of radiation. The slits may form one large slit, but may also be staggered, to be able to modify the intensity in different parts of the beam. Every part mirror may be separately actuatable. The correction which is brought about by the slit may be varied by adapting the width of the slit by means of the part mirror actuator, e.g., by moving the part mirrors towards each other, or vice versa.

In applications where exposure is obtained by means of a time averaged illumination, it is possible to arrange the optical attenuator elements and/or their movement in a direction that contains a non-zero acute angle with a scanning direction. This offers the possibility of smearing out the influence of border lines of the individual optical attenuator elements. For example, in a scanning lithographic apparatus, there is a scan direction, in which an object is moved with respect to the beam and which is often substantially perpendicular to the central line of the beam. The optical attenuator element(s) and/or movement(s) thereof preferably make an angle between 10–45° with said scan direction. An aspect of this measure is that any lines, boundaries etc. between optical attenuator elements are blurred, because neighbouring elements will come to overlap in the integrated illumination. This may be compared with the discussion regarding attenuator elements extending in the scanning direction and present in a field plane.

The first mirror may be movable with respect to the second mirror by means of a mirror actuator. In this embodiment, both the first and the second mirror are movable with respect to each other, and may be moveable in a symmetrical fashion with respect to the slit and/or the central line of said beam of radiation. A symmetrical arrangement introduces a symmetrical correction of the homogeneity of the beam of radiation, with the least ellipticity and telecentricity problems. Again it is noted that more generally, "symmetrical" should comprise "located in a central part of the beam," as described above.

Note that the embodiments with the two (part) mirrors and the slit(s) allows arrangement in a field plane, with precise local control of the intensity, as well as arrangement in a central part, which prevents problems like telecentricity.

In another embodiment of the optical attenuator device according to the present invention, the optical attenuator device comprises at least one optical attenuator element which comprises a body that has at least one channel therein and is made of a material which is transparent for said radiation, wherein the channel is fillable with a medium. In principle it may suffice to offer the possibility to use the change in transmission between an empty attenuator element, i.e., without medium in a channel, and a filled attenuator element, i.e., with medium in a channel, which change may be due to differences in transmission coefficients between the medium and the attenuator body. Even a medium which is 100% transparent will probably give different net reflection losses at the interface between medium and the material of the attenuator element itself. Herein, the term "medium" is intended to comprise liquid material or mixtures, gases, as well as molecular flows, e.g., at pressures of $10^{-1}$ Torr etc.

The optical attenuator device may include an injector for filling at least one of the channels with a controllable amount of the medium. Herein, use is made of a constantly medium filled channel, wherein an optical density of said medium, and hence the attenuator element, is modified by injection of any substance into the medium that will change said optical density, e.g., an ink like carbon black, and so on. This embodiment offers the possibility of providing an optical filter which may change its optical density dynamically without any mechanical moving parts in the beam of radiation.

It suffices to have a sealable opening or an injector in a or each channel for providing the substance. The optical attenuator device may further include a container containing a substance having a higher specific absorption for the radiation than the medium, wherein said injector is constructed and designed for filling at least one of said channels with a controllable amount of said substance. This "on board" supply of the substance allows a truly independent and dynamical adaptation of the intensity even during illumination.

A supply of medium may be provided for the channels, such that fresh medium without said substance is injectable into the channels. This allows a flushing of the channel, in order to reduce the absorption. A preferred injector may comprise injectors which are commonly used in inkjet printers heads, which has the advantage of mature technique and good availability. Other types of injectors are however not excluded.

It is noted that the attenuator element with a channel may be provided with other technical features. In particular, the attenuator element may be provided with a partial reflective or absorptive coating, and two or more attenuator elements may be provided such that they may overlap each other in at least part of the beam. The corresponding advantages will be discussed below, in respect of other preferred embodiments according to the invention.

In another embodiment of the invention, the optical attenuator elements comprise an optical filter element having an optical density which varies as a function of position along a length of the optical filter element, wherein the optical filter element is rotatable with respect to the beam of radiation by means of a filter element rotator. This embodiment allows many different intensity corrections. In the case that the filter has an optical density that varies only as a function of position along the length, the intensity may be corrected by shifting the filter element into or out of the beam, and by rotating the filter element, there may be provided a tilt correction in the intensity, e.g., due to a displacement of the beam or beam source with respect to its desired position. This will be further elucidated in the description of the figures. Note that many different intensity corrections are possible with a relatively small filter element.

The optical attenuator elements may include at least two optical filter elements, each having an optical density which varies as a function of position along a length of the optical filter element, at least one of said at least two optical filter elements being rotatable with respect to another of said at least two filter elements. This embodiment provides even more possibilities for correcting the intensity distribution, by allowing also combinations of two different filter optical densities, by shifting one or more filter elements parallel to themselves, but also, e.g., tilt corrections by rotating one filter element with respect to the other, or by rotating both filter elements in opposite directions over equal angles, i.e., in a symmetrical fashion with respect to each other. An aspect of this type of optical filter elements is that, provided they are larger than the projection of said beam of radiation on the optical filter elements, they may provide a number of different transmission profiles, by moving said optical filter element with respect to said beam of radiation. By using two such optical filter elements in a mirror-symmetrical fashion, a symmetrical intensity profile correction may be obtained, in order to prevent telecentricity problems.

Note that in all cases a favored axis of rotation extends parallel to the direction of the beam of radiation.

An embodiment includes a first optical filter element, having an optical density which varies as a first function of position along a length of the first optical filter element, and a second optical filter element, having an optical density which varies as a second function of position along a length of the second optical filter element, wherein the first function is substantially a reciprocal of the second function. This allows an intensity correction which is itself symmetrical with respect to, for example, a line along the length of the beam. Such symmetrical corrections are advantageous to prevent introduction of, for example, telecentricity. Note that the expression "reciprocal" relates to "equivalent in the opposite direction." In other words, the second optical filter element has the same optical density as the first optical filter element but has been rotated by 180 degrees with respect to the first optical filter element.

In another embodiment according to the invention, said optical attenuator device comprises a plurality of mutually parallel strips which are movable into the beam of radiation and which are made of a material which is between 10% and 100% transparent for said radiation, and preferably between about 80% and about 100% transparent for said radiation.

The optical attenuator device may further include a parallel strips actuator for moving said strips with respect to said beam. By providing such a parallel strips actuator, it is possible to block more or less radiation in the beam, which provides the possibility of modifying the intensity in the beam.

The optical attenuator device may include a first plurality of mutually parallel strips which are movable into the beam of radiation from a first side thereof, and a second plurality of mutually parallel strips which are movable into the beam of radiation from a second side opposite the first side. This offers the possibility of a symmetrical intensity correction, which is useful in view of, e.g., avoiding telecentricity.

It is not strictly necessary to locate said strips in one plane. The strips may be arranged in a plane perpendicular to the beam direction, because this offers the most compact arrangement. Furthermore this will prevent reflection of light in unwanted directions.

The two strips may be located opposite each other with respect to a central line of said beam, possibly symmetrically with respect to said central line. This embodiment has the feature that an even better symmetrical correction is possible. Furthermore, carrying off of heat from absorbing radiation is improved because of the doubled total cross-section of the strips, in other words there is more material for carrying off the same amount of absorbed energy.

The strips of the first plurality of strips may be movable in a first plane, and the strips of the second plurality of strips may be movable in a second plane that is parallel and non-coplanar with the first plane. In this way, movement of a strip will not influence any other strip's movement. At least one strip may be movable into a position in which said at least one strip partly overlaps at least one other strip. This not only allows a broader range of intensity corrections, since overlapping strips cause even more radiation to be removed from the beam of radiation, but it also effectively removes radiation that is scattered off edges of the strips and also prevents that radiation slips through slits between adjacent strips.

An axis of symmetry of at least one strip of said first plurality of strips may be displaced with respect to a corresponding axis of symmetry of at least one strip of said second plurality of strips, for example by half a width of said at least one strip of the first plurality of strips.

This may allow an even more precise intensity correction, because corrections by two adjacent strips from one set of strips on one side of the beam are supplemented by corrections from strips of the other set on the opposite side of the beam at intermediate positions. Furthermore, in the case of overlapping strips, leaking of light between adjacent strips is prevented very reliably.

In one embodiment, the strips of the first plurality of strips extend in a first direction, and the strips of the second plurality of strips extend in a second direction that is non-parallel with the first direction. The first direction may be the mirror of the second direction with respect to an axis of symmetry of the beam of radiation, for example perpendicular to a scanning direction and often the longitudinal direction.

In this embodiment, the influence of any radiation leaking through a slit between adjacent strips is reduced even further, at least in a scanning lithographic apparatus, because such slits are smeared out over many different positions along the direction perpendicular to the scanning direction.

In another embodiment of the invention, the optical attenuator device comprises a mirror and at least one radiation blocking element which is movable through an opening in said mirror by means of a radiation blocking element actuator. Here, the beam of radiation is incident on said mirror under a non-right angle. The radiation blocking element, that extends under a non-zero acute angle with the beam of radiation, e.g., perpendicular with respect to the mirror, will cast a shadow in the beam of radiation. This corresponds to removing a part of the radiation, and thus to the possibility of modifying the intensity distribution. Only the part that protrudes from the mirror surface through the opening serves to block radiation, while the rest of the radiation blocking element, as well as its actuator remains hidden behind the mirror.

Any actuator may be hidden behind the mirror, thus preventing any additional influence on the radiation, while still radiation may be removed from a central part of the beam, when the opening is present in the central part of the beam. This also allows said actuator(s) to be less compact.

The mirror with opening(s) and radiation blocking element(s) is often placed at a strongly defocused position, which provides smearing out of the shapes of the individual radiation blocking elements.

A plurality of radiation blocking elements may be provided in a row that extends in a central part of the beam, and potentially in a direction perpendicular to a scanning direction when used in a scanning lithographic apparatus. This offers local correction possibilities. The elements may be located adjacent in one or a few openings, or they may be located each in a separate opening. It is also possible to design the opening as a slit, preferably one that has a variable width, according to one of the embodiments mentioned above. This allows control over intensity corrections.

In another aspect of the invention, the at least one optical attenuator element includes a filter which comprises a substrate of a material which is transparent for said radiation, and a coating on said substrate, wherein said coating comprises at least one of an anti-reflection coating and an absorptive coating, wherein only on a part of said substrate said coating is present, said part having a length in a longitudinal direction and a width that varies over the length. Such a filter has a different transmission in the coated part and in the non-coated part. Hence by positioning the filter in an appropriate way, a correction of the intensity of the beam may be performed.

In particular, coating is an antireflection coating, and the part where the coating is present is located in the center of the filter, such that the beam of radiation will pass the filter through the coated part. Only the edges of the beam may be influenced by the edges of the coated part when that part is smaller than the beam width. In fact, the edges of the non-coated part that protrude into the beam provide intensity correction, in that those edges transmit less radiation, the width of the part of the edges that protrudes into the beam corresponding to the amount of correction. Note that such an optical attenuator element does not introduce any angular dependency in the intensity distribution, since all attenuation takes place at, in principle, the same distance from the focal plane. In fact, such a filter may be positioned in a field plane, thus offering very precise local control of intensity correction. Such position also prevents introduction of telecentricity problems, since in a field plane it is not possible to remove only part of the directions of radiation that contribute to the illumination of a point of the filed plane. In other words, when a point in the field plane is blocked from radiation by an optical attenuator element, the full cone of radiation is blocked at once. Yet in other words, there are no penumbras in the field plane. If the filter is located away from a field plane, the usually only small difference in transmission between the coated part and the non-coated part ensures that even a width which varies in the edge of the beam will not introduce much telecentricity because of the same reasons as discussed in connection with the partly transmissive strip elements. If desired, it is also possible to design a filter in which the coating has been removed from, or is at least not present in, a central part of the beam. This will even better prevent telecentricity problems.

The coated part may have an axis of symmetry in the longitudinal direction. The width of the coated part may vary as a function of position in said longitudinal direction, which function corresponds to a reciprocal of an integrated intensity of the beam of radiation, as integrated in a scanning direction, preferably a direction perpendicular to said longitudinal direction. This offers a method of providing a filter for intensity correction for a particular beam of radiation, that may be located in a field plane, thus not introducing telecentricity problems, and without problems of scattered light or slits. Moreover, such a filter can be made with very high quality and at a very low price, and it has a high thermal stability.

In another aspect of the invention, there is provided a filter, comprising a substrate with a surface, and an anti-reflection coating, wherein said anti-reflection coating is present on a central part of the filter, and said anti-reflection coating is absent on a remaining part of said surface, said central part of the filter extending in a longitudinal direction from one edge of the filter to an opposite edge of the filter and having a length in said longitudinal direction and a width in a direction perpendicular to the longitudinal direction, wherein said width varies over said length, wherein said central part of the filter has a homogeneous transmission of at least 90% for a predetermined type of radiation, wherein said remaining part has a transmission that is lower than the transmission of said central part of the filter.

This filter allows the possibility of measuring a beam profile without removing the filter out of the beam of radiation, and yet without influencing the beam. When measuring a beam profile, a small measuring probe is passed through the beam in a direction perpendicular to the scanning direction. At every position the intensity is measured. This measured intensity correctly represents the true beam profile in absence of the filter, apart from a very small but homogeneous absorption by the filter.

The transmission of the remaining part may be substantially homogeneous. This offers control over local intensities, especially in the case where the filter is located in or near a field plane.

The homogeneous transmission, of at least 90%, is dependent on the radiation used. For many types of radiation, in particular the longer wavelengths, the transmission for a multi-coated quartz filter may be much higher, e.g., more than 99%. In any case, the transmission is high and homogeneous, while in the non-coated part the transmission is lower.

The central part of the filter may have a homogeneous transmission of at least 98% for the predetermined type of radiation, wherein said remaining part has a substantially homogeneous transmission that is lower than the transmission of said central part of the filter, thus providing a favourable combination of the above mentioned advantages.

In an embodiment of the filter, the central part of the filter has a shape with an axis of symmetry parallel to said longitudinal direction. This provides a symmetrical intensity correction, which is desirable, e.g., to prevent telecentricity problems.

In one aspect of the invention, there is provided a method for producing the filter according to the invention, comprising:

providing a substrate having a surface and having a transmission of at least 90% for a predetermined type of radiation;

applying a removable material on the surface, such that a central part of the filter is kept free from said removable material while a remaining part is covered with the removable material, wherein said central part of the filter extends in a longitudinal direction from one edge of the substrate to an opposite edge of the substrate and having a length in said longitudinal direction and a width in a direction perpendicular to the longitudinal direction, wherein said width varies over said length as a predetermined function of position along said length;

applying an anti-reflection coating over both the removable material and the remaining part of the surface; and removing the removable material together with all of the anti-reflection coating that has been applied over said removable material.

The removable material may, e.g., be a sheet or foil that has been cut in the desired shape. This shape may be determined on the basis of a measurement of the beam profile. Deviations from the desired intensity may be corrected by the filter, by having a corresponding part of the non-coated surface extend into the beam. This may be a one-to-one correspondence if the filter is placed in a field plane. If the filter is located outside a field plane, its shape may be calculated on the basis of the effect of the projection of that shape on the level of the field plane, or in general the surface to be illuminated. This calculation may be carried out by performing a convolution of the desired intensity correction at the level of the field plane to the level of the filter.

The filter may be coated on both sides, since this will tend to maximize the transmission at the coated part. Hence, the width of each of the two coated parts may be adapted accordingly. In most cases, halving the width variations with respect to its average value will do.

An aspect of the invention provides an radiation system constructed to provide a beam of radiation with a homogeneous intensity distribution, comprising a source of radiation, a collector constructed to collect said radiation into the beam of radiation, and an optical attenuator device according to the invention. By thus providing a combination of a source or radiation that provides a beam, and an optical attenuator device according to the invention, the optical attenuator device may be adjusted optimally to the specific properties of the beam provided by the source. Nevertheless, it is also possible to provide an apparatus only with an optical attenuator device according to the invention, wherein the beam is provided from an external source, e.g., by means of mirrors etc. Note that any and all optical attenuator device according to the invention may be used in such a device, while also any combination of two or more optical attenuator devices is possible.

In the above, the source may be any kind of source that provides the desired radiation, e.g., a Hg-lamp, an excimer lamp, etc. The collector may comprise one or more suitable lenses, mirrors etc. In particular, a laser may also be considered to be comprised in the source-collector combination. Herein, the lasing medium is considered the source of radiation, and the laser mirrors are considered the collectors, because these provide the beam.

In an aspect of the present invention, the radiation system further comprises a field facets mirror comprising a plurality of facets that are arranged in the beam of radiation, each facet constructed to reflect a part of the beam of radiation as a reflected part beam, such that at least two of said reflected part beams overlap at a predetermined distance from the field facets mirror, wherein the optical attenuator element comprises at least one rod between the collector and the field facets mirror, wherein the rod extends in a non-parallel direction with respect to the beam of radiation.

This arrangement is useful in so-called EUV apparatus, wherein the source is, e.g., a plasma source providing very short wavelengths, e.g., 15 nm. For these wavelengths there are no known transparent materials that can provide lenses. Hence shaping the radiation into a beam is performed by means of reflectors, such as a paraboloid mirror located opposite the intended beam direction, or a number of concentric curved mirrors located at side of the beam.

The beam of such a source-collector combination is inherently not very homogeneous. Furthermore, because of thermal load, mechanical stresses etc., the mirrors may become slightly non-concentric, defocused etc. Often, use is made of a field facet mirror, arranged such that the incident beam of radiation is reflected by a number of field facets, which are arranged such that two or preferably more of the reflected part beams come to overlap at a predetermined distance. Any inhomogeneity in the original beam and thus in the part beams will be smeared out because the individual intensities are added.

The rod(s) may be any elongate structure, not necessarily straight, but it is often and preferably a straight, bar-like structure. By placing the rod(s) between the collector and the field facet mirror, and depending on the size, orientation etc. of the rod, the shade of the rod(s) is cast on one or more field facets, thus removing a part of the radiation. The exact location of the shadow will vary from facet to facet, and upon a number of facets there will be no shadow at all. The individual shadows will be added and smeared out, but a net intensity correction will be present.

The number of rods is not particularly limited, and may be just one, or also two or more rods.

At least one rod may be rotatable by means of a first rod rotator, around an axis which extends substantially parallel to the direction of the beam of radiation and which intersects the rod. A rotatable rod offers the advantage that the position of the shadows on the facets, and thus the particular shape of the total intensity correction, may be varied.

At least one rod may be a cross-sectional profile that varies over a length of the rod. A varying cross-sectional profile of a rod offers the possibility that the width of the shadow, and hence the amount of radiation that is taken out of the beam, may be varied by moving the rod, e.g., by shifting it in a parallel fashion, or by rotating it.

In a particular embodiment of the radiation system according to the invention, at least one rod that has a cross-sectional profile that varies over a length of the rod is rotatable by means of a second rod rotator, around an axis that extends through the rod parallel to the direction of the length. In particular, the cross-sectional profile is not rotationally symmetric, such that when a rod is rotated, it presents a different effective cross-sectional area to the beam, and will thus remove a different amount of radiation from the beam of radiation.

At least one rod may include expansion means designed and constructed for locally varying its effective cross-sectional area with respect to the beam of radiation. Such expansion means may comprise a movable part, such as one or more rotatable or extendible vanes and a motor to drive them. Other possible expansion means are an inflatable bladder or a part that, when contracted in a certain direction, expands in at least one perpendicular direction. Other expansion means are not excluded, and will occur to the person skilled in the art.

In a particular embodiment, the radiation system comprises at least two rods that enclose an angle between each other. Providing at least two rods, preferably having a different diameter, offers the possibility of modifying the intensity in at least two different ways. For example, a relatively larger correction is needed over a large part of the beam, while in a smaller, more local part of the beam an additional correction is desired. Then, by arranging a first rod having a relatively larger diameter in said first direction, and a second rod having a relatively smaller diameter in second direction, the resulting intensity profile can be made more homogeneous than in the case of just one rod. Other features mentioned in the description of the embodiments with at least one rod may be applied for two or more rods, e.g., rotatability of the rods, expansion means provided on or in the rods etc.

The optical attenuator device according to the present invention is, in principle, not limited to specific applications. However, a preferred field of application is the field of lithography, since there the demands with respect to homogeneity of the projection beam are rather strict. Often also properties like telecentricity and ellipticity play a role here. The optical attenuator device according to the present invention is capable of providing a sufficiently improved homogeneity of a projection beam for a lithographic apparatus. Hence, in another aspect of the invention, there is provided a lithographic apparatus comprising:

a beam receptor arranged and constructed for receiving a beam of radiation;

an optical attenuator device according to the invention, which is located in the beam of radiation, for providing a homogeneous beam of radiation;

a support structure for supporting patterning device, the patterning device serving to impart the homogeneous projection beam with a pattern in its cross-section, thus providing a patterned beam;

a substrate table for holding a substrate; and a projection system for projecting the patterned beam onto a target portion of the substrate.

Such a lithographic apparatus is able to provide a very homogeneous illumination of the substrate. Note that the term "beam receptor" relates to a part of the apparatus where an external beam of radiation enters the apparatus. This may relate to a simple aperture for receiving, e.g., a laser beam, or a lens etc. In other words, this embodiment relates to apparatus without an internal source of radiation, but with much flexibility as to possible sources to be used.

However, the invention also relates to a lithographic apparatus comprising:

an radiation system according to the invention, for providing a projection beam of radiation;

a support structure for supporting patterning device, the patterning device serving to impart the projection beam with a pattern in its cross-section, thus providing a patterned beam;

a substrate table for holding a substrate; and a projection system for projecting the patterned beam onto a target portion of the substrate.

This embodiment relates to apparatus with built in radiation source, in which the radiation system, and in particular the optical attenuator device, may be adapted optimally to the source of radiation.

The apparatus as mentioned above comprise generally all lithographic apparatus, such as steppers. However, in an advantageous lithographic apparatus, the patterning device and substrate table are movable with respect to the beam of radiation in a scanning direction, the beam of radiation being incident on the patterning device on an incidence area, wherein the at least one optical attenuator element is present in a part of the incidence area. This embodiment relates to scanning lithographic apparatus. An advantage in this type of apparatus is that the total intensity in one point is an integrated intensity, since the beam sweeps as an often relatively narrow bundle over the surface to be illuminated, often the patterning device. This offers the possibility of correcting the intensity in only part of the beam, such that the total integrated intensity becomes the desired intensity. The correction may, e.g., be built up as a total blocking of a part of the beam of radiation in a small part of the sweep, while other parts of the sweep are not affected. Since these latter parts will contribute to the total illumination, there will not be a dark spot. In the case of a stepper, where the whole illumination takes place in one "flash," without any sweeping of the beam, a local correction by totally blocking radiation would cause such dark spots, which is undesirable.

The above principle holds for (scanning) lithographic apparatus without an internal source of radiation, but also with an internal, i.e., built in, source of radiation.

In a further aspect the invention provides a device manufacturing method comprising:

providing a substrate;

providing a projection beam of radiation using a radiation system according to the invention;

using a patterning device to impart the projection beam with a pattern in its cross-section; and projecting the patterned beam of radiation onto a target portion of the substrate.

By using an radiation system, or a lithographic apparatus, according to the present invention, a very homogeneous illumination of the substrate can be ensured, which results in a very high quality of the features imparted to the substrate. With such an illumination it is possible to provide very homogenous interaction of the radiation and the illuminated object, such as a substrate. This may allow smaller features to be projected onto the target portion of the substrate than was possible up to now. Additionally, such illumination improves the homogeneity of features created on a substrate, both as to, e.g., line width of a single feature over its length, but also as to uniformity of features such as line widths etc. over all of the illuminated surface. This is sometimes referred to as "Critical Dimensions" uniformity, or CD-uniformity.

The invention has been described in the above. Below, background information is given which will help the person in the art to better understand the present invention. Said information is however not to be understood as limiting the invention.

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. Further, the substrate referred to herein may be processed, before or after exposure, in for example a track (a tool that typically applies a resist to a substrate and develops the exposed resist) or a metrology or inspection tool. Where applicable, the disclosure herein may be applied to such and other substrate processing tools.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5–20 nm), as well as particle beams, such as ion beams or electron beams.

The term "patterning device" used herein should be broadly interpreted as referring to structures that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device."

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion medium or the use of a vacuum. Any use of the term "lens" herein may be considered as synonymous with the more general term "projection system."

The optical attenuator device may also encompass various types of optical components, including refractive, reflective, and catadioptric optical components for directing, shaping, or controlling the projection beam of radiation, and such components may also be referred to below, collectively or singularly, as a "lens."

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying diagrammatical drawings in which corresponding reference symbols indicate corresponding parts, and in which:

FIGS. 4a and 4b diagrammatically depict an optical attenuator device according to a second embodiment of the invention;

FIGS. 5a and 5b diagrammatically show two modified second embodiments of the optical attenuator device according to the invention;

FIG. 6 shows three width/thickness profiles of a ribbon for use in the second embodiment of the optical attenuator device according to the invention;

FIG. 8 shows a front view of the embodiment according to FIG. 7;

FIG. 9 is a cross-sectional view of a rod for the third embodiment of FIG. 8;

FIG. 10 provides a perspective view of an alternative rod of the third embodiment of FIG. 8;

FIGS. 19a-c show a diagrammatical overview of the working of the embodiment according to FIG. 7.

DETAILED DESCRIPTION OF PREFERRED EMBODIMENTS

Figure 1A:
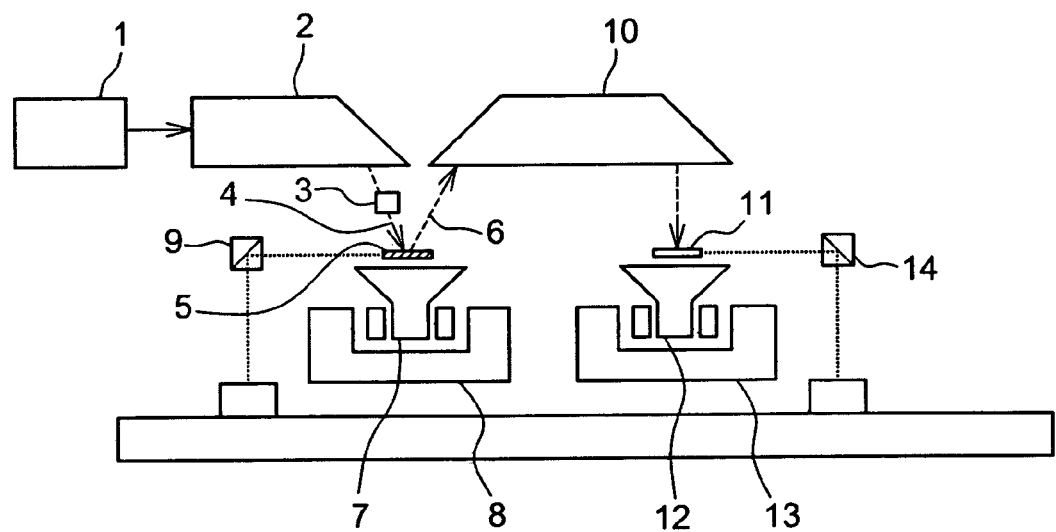
FIGS. 1a and b diagrammatically depict a lithographic apparatus according to an embodiment of the invention, with reflective optics and transmissive optics, respectively.

A general remark to be made here is that where a figure is said to depict an optical attenuator device or an illumination system, the drawing is sometimes limited to an optical attenuator element to be used in the optical attenuator device or illumination system according to the invention. It is however to be understood that the optical attenuator device or illumination system is then to be complemented with parts such as a source of radiation and beam shaping means.

FIGS. 1a and b diagrammatically depict a lithographic apparatus according to an embodiment of the invention, with reflective optics and transmissive optics, respectively.

FIG. 1a diagrammatically depicts a lithographic apparatus according to a particular embodiment of the invention. The apparatus comprises:

- a source of radiation 1 and an illumination system (illuminator) 2 with an optical attenuator element 3, for providing a projection beam 4 of radiation (e.g., UV or EUV radiation).
- a first support structure (e.g., a mask table) 7 for supporting patterning device (e.g., a mask) 5 and connected to first positioning means 8 for accurately positioning the patterning device with respect to item 10;
- a substrate table (e.g., a wafer table) 12 for holding a substrate (e.g., a resist-coated wafer) 11 and connected to second positioning means 13 for accurately positioning the substrate with respect to item 10; and
- a projection system (e.g., a reflective projection lens) 10 for imaging a pattern imparted to the projection beam 4 by patterning device 5 onto a target portion (e.g., comprising one or more dies) of the substrate 11.

As here depicted, the apparatus is of a reflective type (e.g., employing a reflective mask or a programmable mirror array of a type as referred to above). Alternatively, the apparatus may be of a transmissive type (e.g., employing a transmissive mask), see FIG. 1b.

The illuminator 2 receives a beam of radiation from a radiation source 1. The source and the lithographic apparatus may be separate entities, for example when the source is a plasma discharge source. In such cases, the source is not considered to form part of the lithographic apparatus and the radiation beam is generally passed from the source 1 to the illuminator 2 with the aid of a radiation collector comprising for example suitable collecting mirrors and/or a spectral purity filter. In other cases the source may be integral part of the apparatus, for example when the source is a mercury lamp. The source 1 and the illuminator 2, may be referred to as a radiation system.

The illuminator 2 may comprise adjustable optical elements for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam 4, having a certain uniformity and intensity distribution in its cross-section, which may be modified and improved by means of optical attenuator element 3. Note that the optical attenuator element 3 may be integrated in the illumination system 2, but also be a separate part, e.g., to be incorporated into existing illumination systems. It is only for clarity that it is shown as a separate part in FIGS. 1a and 1b.

The projection beam 4 is incident on the mask 5, which is held on the mask table 7. Being reflected by the mask 5, the projection beam 4 becomes a patterned projection beam 6 and passes through the lens 10, which focuses the beam onto a target portion of the substrate 11. With the aid of the second positioning means 13 and position sensor 14 (e.g., an interferometric device), the substrate table 12 can be moved accurately, e.g., so as to position different target portions in the path of the beam 4. Similarly, the first positioning means 8 and position sensor 9 can be used to accurately position the mask 5 with respect to the path of the beam 4, e.g., after mechanical retrieval from a mask library, or during a scan. In general, movement of the object tables 7 and 12 will be realized with the aid of a long-stroke module (coarse positioning) and a short-stroke module (fine positioning), which form part of the positioning means 8 and 13. However, in the case of a stepper (as opposed to a scanner) the mask table 7 may be connected to a short stroke actuator only, or may be fixed. Mask 5 and substrate 11 may be aligned using mask alignment marks and substrate alignment marks.

The depicted apparatus can be used in the following preferred modes:

1. In step mode, the mask table 7 and the substrate table 12 are kept essentially stationary, while an entire pattern imparted to the projection beam is projected onto a target portion in one go (i.e., a single static exposure). The substrate table 12 is then shifted in the X and/or Y direction so that a different target portion can be exposed. In step mode, the maximum size of the exposure field limits the size of the target portion imaged in a single static exposure.

2. In scan mode, the mask table 7 and the substrate table 12 are scanned synchronously while a pattern imparted to the projection beam is projected onto a target portion (i.e., a single dynamic exposure). The velocity and direction of the substrate table 12 relative to the mask table 7 is determined by the (de-)magnification and image reversal characteristics of the projection system 10. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table 7 is kept essentially stationary holding a programmable patterning device, and the substrate table 12 is moved or scanned while a pattern imparted to the projection beam is projected onto a target portion. In this mode, generally a pulsed radiation source is employed and the programmable patterning device is updated as required after each movement of the substrate table 12 or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
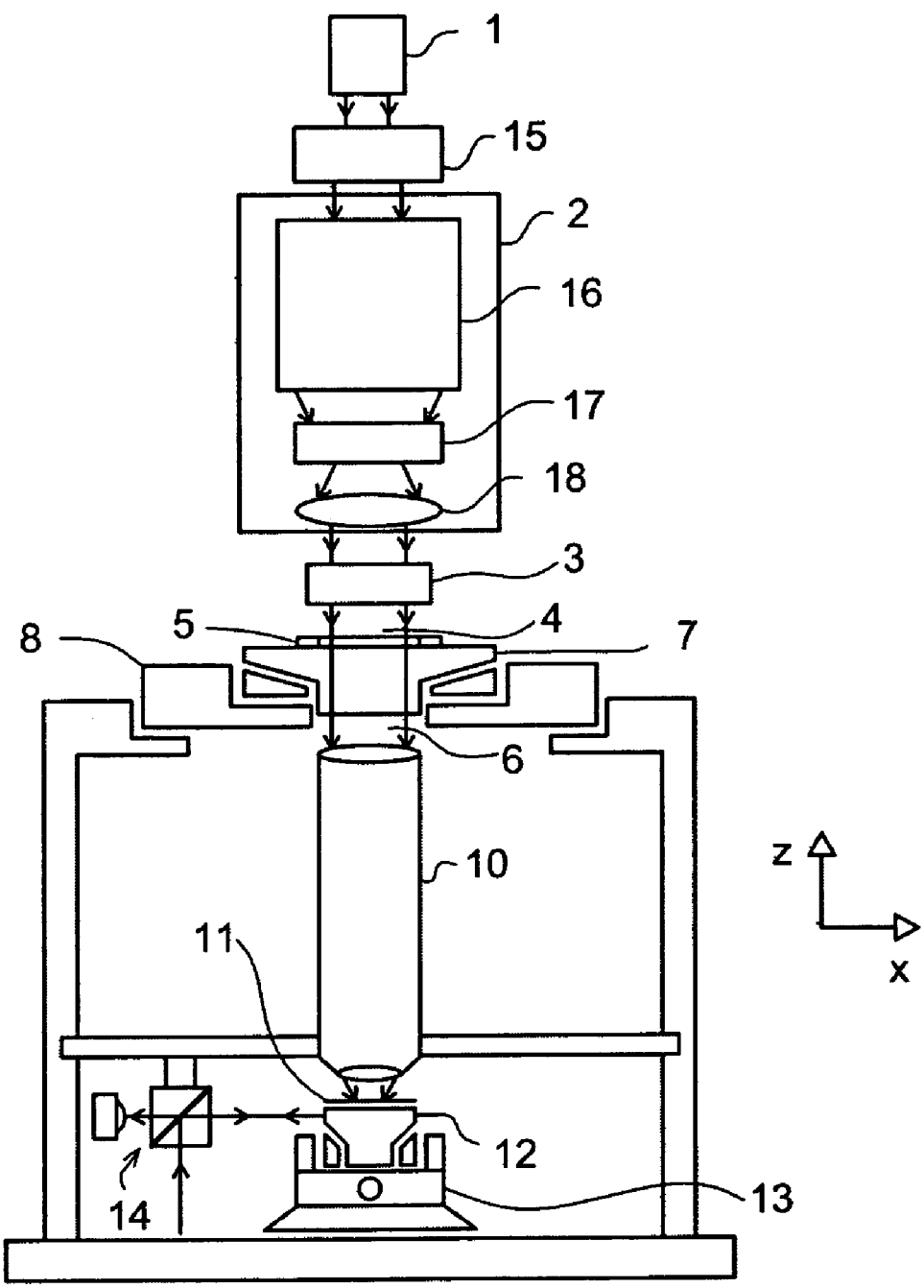

In FIG. 1b, as in the rest of the application, similar parts are denoted by similar reference numerals.

In particular, as here depicted, the apparatus is of a transmissive type (e.g., employing a transmissive mask).

The illuminator 2 receives a beam of radiation from a radiation source 1. The source and the lithographic apparatus may be separate entities, for example when the source is an excimer laser. In such cases, the source is not considered to form part of the lithographic apparatus and the radiation beam is passed from the source 1 to the illuminator 2 with the aid of a beam delivery system 15 comprising for example suitable directing mirrors and/or a beam expander. In other cases the source may be integral part of the apparatus, for example when the source is a mercury lamp. The source 1 and the illuminator 2, together with the beam delivery system 15 if required, may be referred to as a radiation system.

The illuminator 2 may comprise adjustable optical elements 16 for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator 2 generally comprises various other components, such as an integrator 17 and a condenser 18. The illuminator provides a conditioned beam of radiation, referred to as the projection beam 4, having a desired uniformity and intensity distribution in its cross-section.

FIGS. 1a and 1b are general figures, only serving to indicate some of the possible applications of the illumination system according to the invention. Note that it is possible to accommodate optical attenuator elements 3 at different position, e.g., after the patterning device 5, i.e., in the patterned beam 6. In that case it has to be taken into account that every influence on the intensity distribution of the patterned beam will have a corresponding influence on the pattern in the patterned beam, but it is not excluded.

Figure 2:
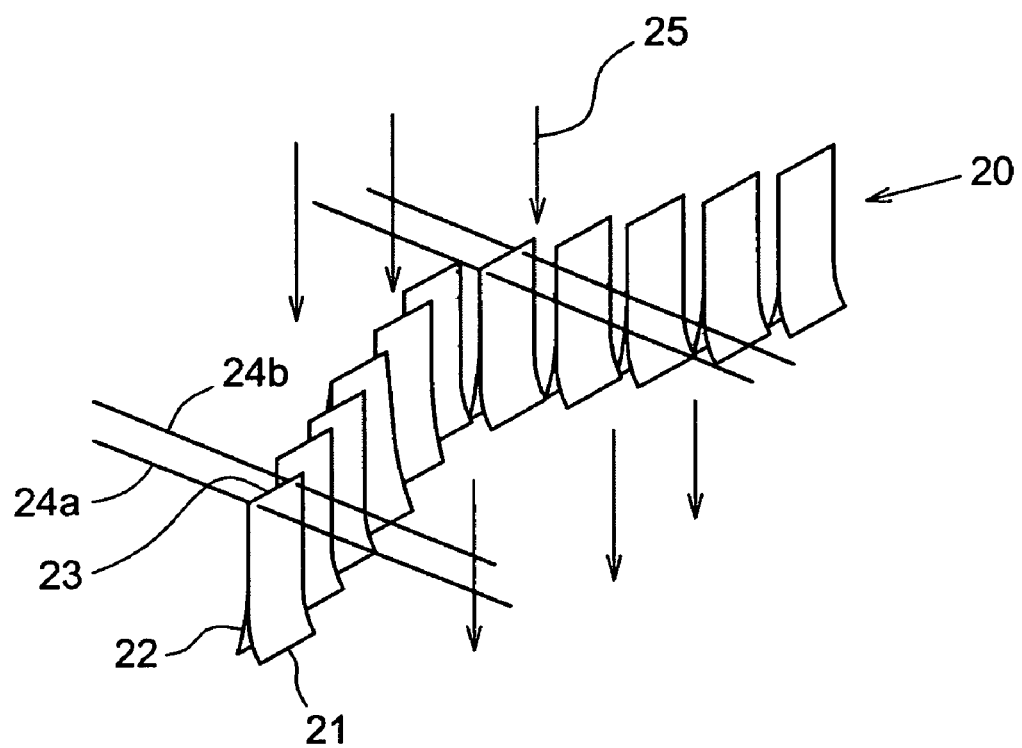
FIG. 2 diagrammatically depicts a first embodiment of an optical attenuator element for an optical attenuator device according to the invention.

FIG. 2 diagrammatically depicts a first embodiment of an optical attenuator element for an illumination system according to the invention. Herein, 20 denotes a number of optical attenuator elements, each consisting of two sheets 21 and 22, connected to each other at common edge 23. Each optical attenuator element is suspended by means of two wires 24a and 24b.

The optical attenuator elements 20 are arranged in a beam of radiation 25, which travels along the direction indicated by the arrows.

The optical attenuator elements are constructed such as to be movable around an axis that coincides with the common edge 23. The means for bringing about this movement will be discussed in connection with FIGS. 3a and 3b. The means of suspension may also be rigid shafts, and so on. It is preferred to use a suspension that presents only a small cross-sectional area to the beam 25, in order not to influence the intensity distribution. In another embodiment, the suspension means extend in the direction of the beam 25. This may be achieved by means of wires, axes etc. between the two sheets 21 and 22, which in turn may be connected to a motor (not shown) etc. for driving the sheets 21 and 22. This arrangement need not pose problems for the intensity distribution if it is ensured that those motor means and other parts with a possibly large cross-sectional area are located sufficiently far out-of-focus. Herein, it is assumed that the elements 20 are located substantially in a local focal point of the beam, or at least nearer to that focal point than are the motor means.

The optical attenuator elements 20 are shown arranged parallel to the beam 25. This offers the advantage that, in case no correction of the intensity is required, the sheets 21 and 22 of the elements 20 are simply arranged parallel to the beam. It is also possible to arrange the elements 20 in another fashion, e.g., under an angle with the beam, which angle may be different for every element 20. This may be useful if there is a certain offset or standard correction required, to which standard correction changes may be added by moving the elements around an axis, or by otherwise deforming the elements 20 such that the effective cross-section they present to the beam 25 is changed.

The elements 20 are shown in substantially V-shaped arrangement. Any other useful arrangement is allowed as well, wherein an arrangement in which all elements 20 are present in a central part of the beam 25 is advantageous. In particular, a linear arrangement, in which all elements are aligned along, e.g., a central line of the beam 25, is useful in many cases. In other cases, the beam itself is not rectangular, such as is the case in many EUV lithographic systems. In those cases it is advantageous to arrange the elements such that they are located in a central line, or more precisely a central curve, of the beam.

Figure 3A:
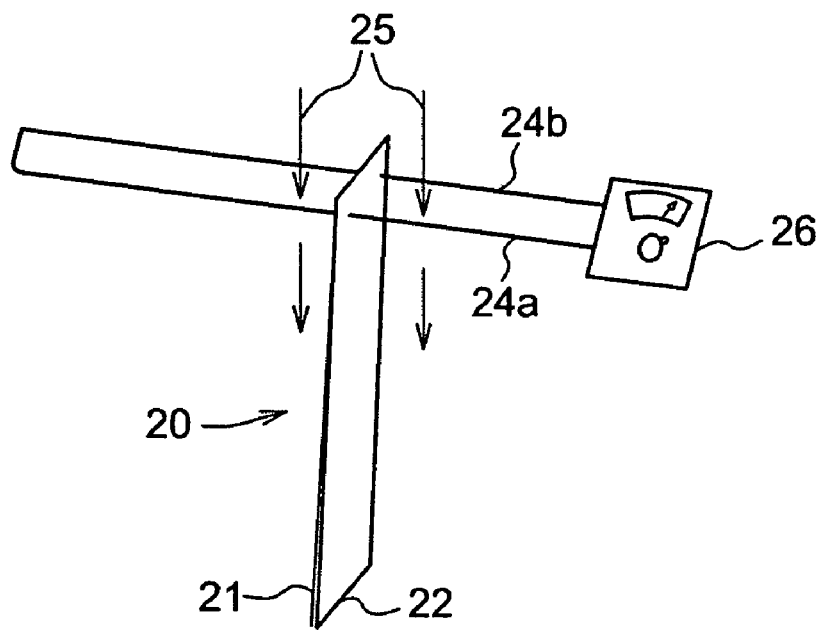
FIGS. 3a and b illustrate a means of actuating the optical attenuator element of FIG. 2.

FIGS. 3a and b illustrate a method of actuating the optical attenuator element of FIG. 2. Optical attenuator element 20 comprises two sheets 21 and 22, connected at common edge 23. The element 20 is suspended from two electrical wires 24a and 24b. A beam of radiation 25 is present. An electrical source is denoted by 26.

The sheets 21 and 22 of the element 20 are made of a flexible material that comprises an electrically conductive material. The sheets can be made from, e.g., metal foil, or of a plastic material coated with electrically conductive foil or paint etc. The coating may be present on part of the surface of the sheets, and on one or both sides of the sheets.

Electrical source 26 is capable of supplying an electrical charge, and often comprises either a current source or a voltage source. Advantageously, the electrical source 26 is adjustable, such that an adjustable charge may be supplied to the sheets 21 and 22 through electrical wires 24a and/or 24b. Note that it should be possible for charge to be drained from the sheets by means of the same or additional wires.

In FIG. 3a, the electrical source 26 is set such that no electrical charge is present on sheets 21 and 22. This may be brought about by opening a switch (not shown) and draining any possibly present charge, or by simply setting the source 26 to a low or zero value. Without any charge being present on the sheets 21 and 22, there will be no mutually repulsive force and both sheets will be adjacent each other, presenting the least cross-sectional area to the beam 25, as indicated by the arrows.

Figure 3B:
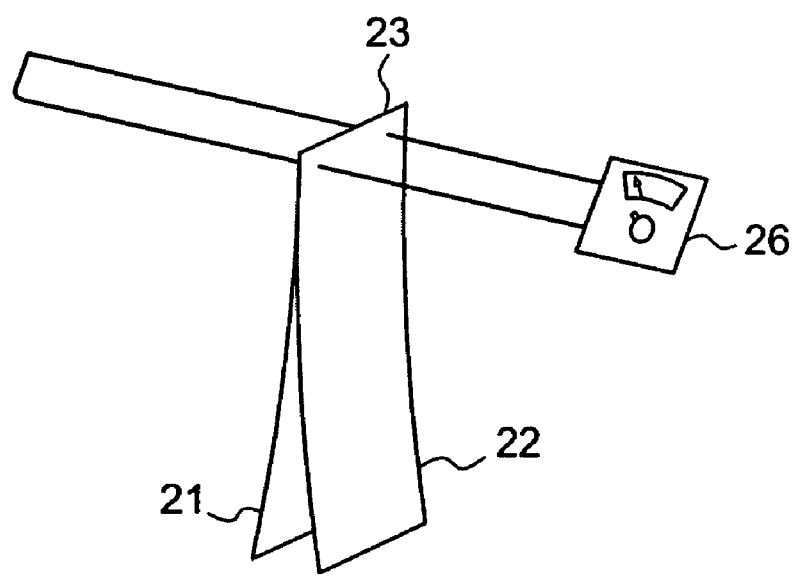

In FIG. 3b, the source is set to some non-zero, higher value, with the result that a non-zero charge is present on the sheets 21 and 22. This charge will cause the sheets 21 and 22 to repel each other, which results in either a bending or other deformation of the sheets or in a rotation of the sheets around the common side 23. In any case, the cross-sectional area of the element 20 presented to the beam 25 has now increased, and the element will absorb or scatter more radiation. By selectively adjusting the charge by means of source 26, it is possible to vary the amount of radiation that is removed from the beam 25.

FIGS. 4a and 4b diagrammatically show a cross-sectional side view, and a front view, respectively, of an illumination system according to a second embodiment of the invention.

Herein, 28 denotes an illumination lens, providing a projection beam 4, which hits a substrate 5. A ribbon is denoted by 30, and 31 and 32 denote two reels.

The ribbon 30 is provided in the projection beam 4 and will take away a part of the radiation from beam 4, depending on the relative dimensions of the ribbon with respect to the beam dimensions. Since in most cases the dimensions of the beam 4 are fixed, it is possible for the ribbon to have different sections, each having a different dimension, viz. width. More generally, the ribbon has a plurality of sections having a different width profile, since the width need not be a constant over the length of the ribbon.

The different sections of the ribbon may be selected and placed in the beam by means of two reels 31 and 32, onto which the ribbon 30 is wound. A reel drive (not shown) may then be used to rotate the reels such that the desired section of the ribbon is located in the beam. Any kind of reel drive known in the art may be used, but often a motor which is coupled to an axis of the reel(s) will be used.

The position of the ribbon as a whole with respect to the beam may also be adjustable. Thereto, second reel drive means may be employed, for shifting the position of one reel or both reels with respect to the beam, in a direction perpendicular to the ribbon 30. If both reels are displaced, this may be done over equal distances, such that the ribbon is displaced parallel to itself. In case both reels are displaced over different distances, or in opposite directions, or if only one reel is displaced, then the orientation of the ribbon may also be changed. In the case of static illumination, this offers the possibility to attenuate a different part of the beam.

The position to arrange the ribbon may be selected from a large variety of possible places. This relates to the small dimensions which are possible with a ribbon: in principle it is the thickness of the ribbon which determines the space requirements. If there is not much space next to the beam, it is possible to let the ribbon span a larger distance than just the dimensions of the beam, and locate the reels at a larger distance, at a location where there is enough space for the reels. In for example a lithographic apparatus it is possible to locate the ribbon not right below the illumination lens 28 as shown in the FIGS. 4a,b, but also, e.g., close to any other field plane.

The thickness of the ribbon may be selected in dependence of the mechanical properties of the material of the ribbon. E.g., if a suitable plastic, coated or not, or metal is selected for the ribbon material, a thickness of between 0.02 and 1 mm is suitable. The width of the ribbon depends on the width of the beam 4 and the amount of radiation to be blocked. For example if maximum 10% is to be blocked, and the width of the beam 4 is 10 mm, then the maximum width of the ribbon 30 should be 1 mm. The length of the ribbon 30 depends on the number of desired width profiles, and will be at least as long as the dimension of the beam 30 in the direction in which the ribbon extends. For example, if the beam has cross-sectional dimensions 30×10 mm, the ribbon extends in the longest dimension, and it is desired to have 10 different ribbon profiles, then the ribbon should be at least 300 mm long.

The way to block radiation may be by blocking the radiation by way of the material of the ribbon itself, or by way of a coating present on the ribbon. The first possibility is simplest, and allows the use of all-metal ribbons which are able to withstand shorter wavelength radiation than can transparent plastic ribbons with an absorbent coating. However, transparent plastic ribbons with a coating, e.g., a metal coating or paint, or with locally applied absorbers in the material of the ribbon, offer the advantage that it is possible to have a section of the ribbon which is completely transmissive. This is useful in cases where no correction is needed.

In the above cases, the orientation of the ribbon is in a plane substantially perpendicular to the beam. It is however also possible to orient the ribbon in a plane parallel to the beam and parallel to a central line of the beam. In FIG. 4b this would be the plane of the paper. Of course the position of the reels would then be adapted accordingly. In this case it is not the width of the ribbon but the thickness which determines the amount of blocked radiation. In cases where only a relatively small amount of radiation needs to be blocked this possibility allows very good control over the amount, and also offers the possibility of a relatively rigid and rugged construction of the ribbon, since the strength and other mechanical properties thereof are positively influenced by the width of the ribbon, which may be freely selected without influencing the absorption properties of the ribbon.

Alternatively, e.g., in cases where there are very stringent space requirements, it is possible to use a wire instead of a ribbon 30. Herein, the thickness of the wire determines the amount of absorbed radiation. The wire may be wound on a reel or spool.

FIGS. 5a and 5b diagrammatically show two modified second embodiments of the illumination system according to the invention.

In FIG. 5a, 30 again denotes a ribbon which is wound on two reels 31 and 32. An integrator rod is denoted by 33. This FIG. 5a shows an alternative location for the ribbon 30, in case of a transmissive illumination system. Note that still other positions are possible, for example in front of a mirror in a reflective optical system in, e.g., an EUV lithographic apparatus.

FIG. 5b shows a double ribbon system, wherein 34 denotes a second ribbon, wound on two reels 35 and 36.

The presence of two ribbons allows more different corrections with a smaller amount (length) of ribbon, since it is the combination of the two corrections which determines the total correction. This may be obtained by using one of the two ribbons for correction of tilt in the beam intensity of the illumination system, which is indicated by beam 30 which shows a linearly increasing width (or thickness). The other ribbon 34 may be used to correct random variations, as shown by an irregular width/thickness of ribbon 34.

The two ribbons 30 and 34 may be arranged such that both extend in a central part of the beam of radiation, and preferably in a side by side fashion.

FIG. 6 shows three width/thickness profiles of a ribbon for use in the second embodiment of the illumination system according to the invention.

The rightmost profile indicates a linearly increasing dimension, which may be used to correct, e.g., tilt in a beam. The other two profiles are irregular, and may be used for correction of random variations in the intensity profile of the beam.

Figure 7:
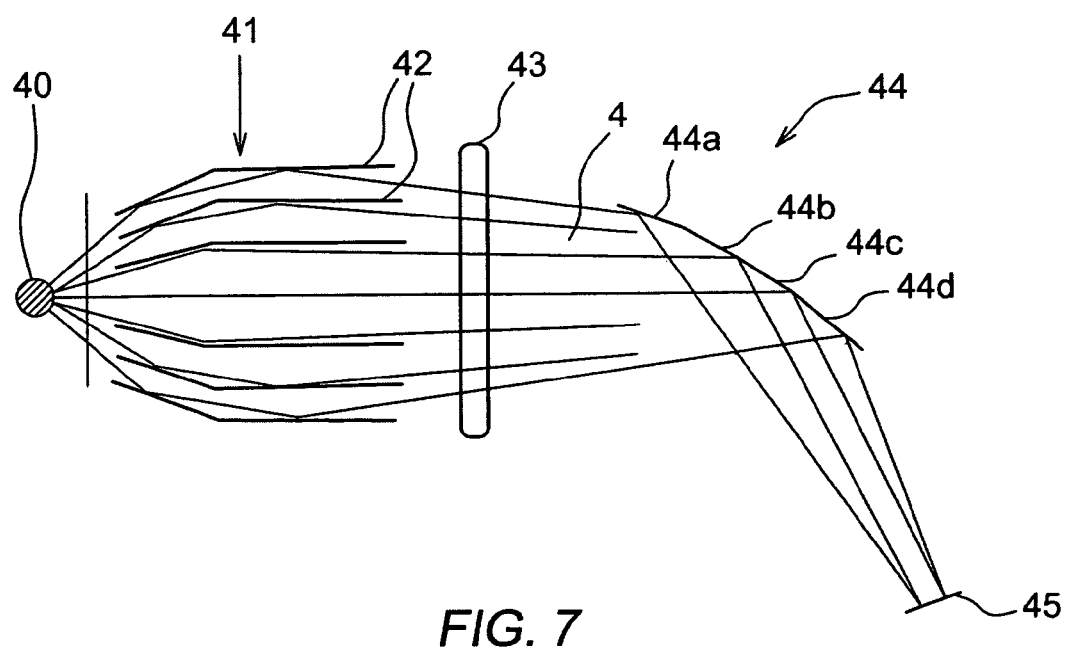
FIG. 7 shows a side view of a third embodiment of an optical attenuator device according to the present invention.

FIG. 7 shows a side view of a third embodiment of an illumination system according to the present invention. FIG. 19a-c is a diagrammatical front view, showing how this embodiment works.

Herein, 40 denotes a source of radiation, 41 is a collector comprising a number of concentric reflectors 42. An optical attenuator element is denoted by 43.

A field facets mirror is denoted by 44, and has in this case four facets 44a through 44d, which cast four part beams onto a surface 45.

In FIG. 7, a possible position for an optical attenuator element in an illumination system according to the invention is shown. This particular radiation system may be employed in EUV lithographic systems, comprising a source 40 of EUV radiation, having a wavelength of, e.g., about 13.5 nm. For this wavelength there exists no known material having a sufficient transmission for creating transmissive optics. Any required lens action is then obtained by means of an arrangement as diagrammatically shown, namely one in which a collector 41 is used which comprises a number of concentric mirrors 42. The mirrors 42 have such a shape that they are capable of reflecting the rays of beam 4 such that they converge. Note that it is possible to provide a lens action in only one direction, or different lens actions in two directions, e.g., to obtain a more or less narrow beam of radiation.

The beam 4 is incident on a field facets mirror 44, which has four field facets. In practice this number will be (much) higher. Every facet will reflect a part beam. A number of these part beams, not necessarily all, are made to overlap at a certain distance of the field facets mirror 44, e.g., at the position of a surface 45, which may be a patterning device, or another mirror, etc.

Optical attenuator element 43, of any appropriate embodiment according to the present invention, is located near an exit end of the collector 41. This allows a precise control over position and blocking action of the attenuator element 43, and has the further advantage that the radiation intensity is relatively low. Hence the radiation load on attenuator element 43 is relatively low, and its degrading effect on the material of the attenuator element through heating etc. is well controllable.

For the effect of the optical attenuator element, we now turn to FIG. 19a-c, showing a front view of this embodiment. FIG. 19a shows an intensity distribution as it exits the collector 41 after the rods 43, FIG. 19b shows a frontal view of a field facets mirror, while FIG. 19c shows the intensity distribution on the field facets mirror.

In FIG. 19a, the shadow of a suspension system for the concentric mirrors 42 may be discerned, as well as concentric lighter and darker regions, reflecting the shape and set-up of the collector. Furthermore, the shadow of two rods 43a and 43b is shown.

FIG. 19b shows a field facets mirror 44, consisting of a large number of facets 44a, e.g., having the aspect ratio of a desired beam of radiation. Note that the horizontal axis is not covered by facets, because there would only be shadow from the collector mirror suspension. A number of field facets is directed such that the part beams reflected from those facets come to overlap, e.g., at the level of the patterning device.

FIG. 19c shows the actual intensity distribution of the beam 4, having passed the rods 43, onto the filed facets mirror 44.

The shadow of the rods 43 is cast on a number of facets only. One half of the number is indicated by 44a through f. Note that the shadow is cast only in the rightmost part of each facet. On the left side of the mirror, this corresponds to the leftmost part. In all, when all facets are made to overlap, the net result will be that only in the outermost parts of the resulting beam of radiation there will be a shadow. In other words, in the outermost parts of the beam a part of the radiation will have been removed. By appropriately arranging of the rods 43, a desired part of the radiation may thus be removed from the beam, be it in the center or in other parts thereof.

FIG. 8 shows a front view of the embodiment according to FIG. 7. Herein, 41 again denotes a collector having a number of concentric reflectors 42. A non-limiting number of three optical attenuator element rods are denoted 46, 47 and 48. A local expansion means is denoted by 49. The rods are rotatable around an axis 50.

The rods 4–48 block part of the radiation passing through the collector 41, in this case for example out of the plane of the paper. The dimensions of the rods, in particular the cross-sectional area they present to the beam of radiation, and the orientation with respect to the beam may be selected according to the desired influence on the intensity distribution. The cross-sectional dimensions of the rods need not be equal, and need not be a constant over their length. E.g., the rods may be thinner near the center of the beam than near an edge.

The orientation may for example be modified by rotating one or more rods round an axis 50, as indicated by the arrows, and by means of rod rotating means (not shown). It may also be possible to shift a rod out of the center of the beam if desired.

One or more rods may be provided with one or more expanding sections 49, of which only one is shown for clarity. Such expanding sections may locally vary the cross-sectional area (or thickness, or width) of the rod, in order to increase the amount of radiation blocked. The expanding sections may comprise any known mechanism for increasing said dimension, such as an inflatable part, a part that may be extended or folded out, a part that may expand under compression or contraction of the rod along its longitudinal axis etc. By controlling individual expanding sections distributed over one or more rods, it is possible to modify the intensity distribution of the beam of radiation in a finely controlled fashion.

Although three rods are shown, any number, such as one or two, or large numbers such as 10, may give satisfactory results. Some rods may extend in parallel, while others are arranged radially and passing through an axis 50.

FIG. 9 is a cross-sectional view of a rod for the third embodiment of FIG. 8.

A rod 51 is rotatable round a longitudinal axis 52, as indicated by an arrow B. A beam of radiation 4 travels in the plane of the paper.

As shown, the rod 51 presents the smallest cross-sectional area to the beam 4, e.g., in the case when the intensity distribution needs little or no correction in the direction of the rod 51. When more radiation should be blocked, it is possible to rotate rod 51 round axis 52 by means of any suitable rotating actuator, such that it presents a different cross-sectional area. E.g., by rotating over 90°, the cross-sectional area may be made largest. Note that a combination of the rotation round a longitudinal axis 52 may be combined with a rotation round a perpendicular axis, as described in connection with FIG. 8, in order to give an even better control over homogeneity of the beam.

FIG. 10 provides a perspective view of an alternative rod of the third embodiment of FIG. 8.

A rod 53 is rotatable round an axis 52, has an end face 54 and has ventral sections 56 and nodes 55. A beam 4 of radiation travels in the plane of the paper along the arrows shown.

The rod 53 shows another possibility of flexibly influencing the intensity distribution. As shown the rod presents a cross-sectional profile to the beam 4 that shows local variations along the length of the rod. Although indicated as regularly alternating, the ventral sections 56 and nodes 55 may be distributed irregularly along the rod 53.

As can be seen from the end face 54, which is an indication for the cross-section of the rod 53, the dimensions of the rod as observed from a perpendicular direction to the beam 4, which may be presented by rotating rod 53 over 90° around axis 52, may be totally different. In principle, this corresponds to the situation described with respect to FIG. 9. Additionally, however, it is possible to have the rod 53 shaped such that the nodes and ventral sections are located at different positions when compared to the perpendicular direction. This offers even more possibilities to influence the homogeneity of the beam 4.

Figure 11:
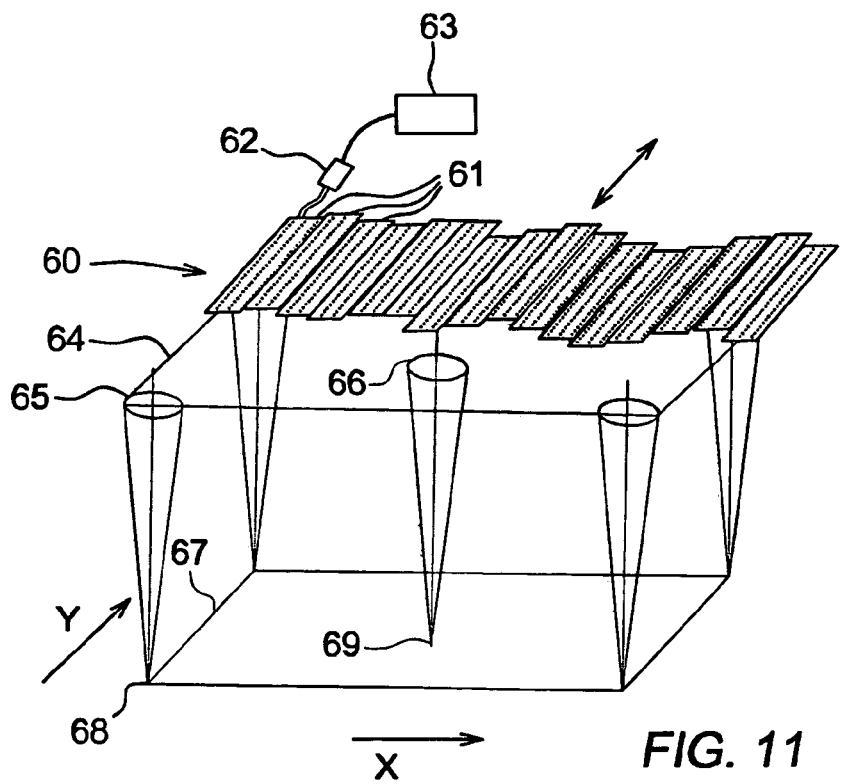
FIG. 11 diagrammatically illustrates a fourth embodiment of the illumination system according to the invention.

FIG. 11 diagrammatically illustrates a fourth embodiment of the illumination system according to the invention.

In FIG. 11, 60 denotes an optical attenuator element comprising a plurality of movable strips 61, which are coupled to strip drive means 62, and 63 denote strip drive control means.

A cross-section of the beam of radiation at an out-of-focus position is indicated at 64, with exemplary radiation cones 65 and 66. These correspond to spots 68 and 69, respectively, in a field plane 67 of the beam.

In a scanning type of lithographic apparatus, in which the beam will scan across the surface to be illuminated, it makes a difference whether radiation in the edge of the beam is blocked, or whether radiation only in the central part of the beam is blocked. Herein, "edge" means that part of the beam in which the cones are not complete because a part would have to be contributed but cannot be contributed by cones from points outside the filed or focal plane 67. The edge has zero width in the actual field plane, and an increasing width with increasing distance from the field plane 67.

"Central part" means that part of the beam in which the cones are surrounded on all sides by other cones of full and complete intensity distribution. If an optical attenuator element extends into the beam only in a part of the edge, then a shift in position into the beam will change the contribution from certain directions more than for other directions. Contrarily, when the optical attenuator element extends only into the central part of the beam, a shift will change the contributions of all directions in equal amounts.

In the extreme case: when an optical attenuator element is just moved into the extreme edge of the beam, only rays in a small part of the cones of just the extreme edge are blocked, whence only their contribution is deleted. Moving the optical attenuator element a little further into the beam will increase the blocked part of those cones, while deleting a small part of the neighboring cones. Up to the situation in which the optical attenuator element is moved into the edge of the beam over a distance of the width of a cone, the contribution of rays in the corresponding half of the cones in the edge is decreased, and it changes up to that moment. After that, i.e., in the central part, any shift takes away equal amounts of any direction.

This change in the relative contribution of the various directions may be corrected by moving a similar optical attenuator element into the beam from the opposite side of the beam, in order to obtain a mirrored influence. Note that, although now two parts of the beam, nl. two edges, have incompletely, asymmetrically filled cones of radiation, the total radiation that contributes after integration in the scanning direction shows symmetry.

An even more preferable way of blocking radiation would be to remove only radiation from the central part of the beam, since then just all rays passing through the blocked points are removed from the beam, and in principle all those rays are the equivalent of one or more completely filled cones. Note that in the edge, these equivalent cones would not be completely filled, because at least some rays would be missing, viz. those coming from points that lie outside the field 64.

Note that as mentioned above it is possible, and even preferred, to combine two of such sets of strips, one set on each side of a beam of radiation. This offers the advantage that the beam is adjusted in a symmetrical fashion, which prevents telecentricity and ellipticity problems even better.

FIGS. 12*a* and *b* illustrate alternative embodiments of a detail of FIG. 11.

Herein, 80 denotes a first strip, comprising a first part 81 and a second part 82, divided at a line 83. A second strip 84 is located adjacent strip 80, and overlapping at a step-like part 85.

The strip 80 comprises a first part 81 having a transmission of, e.g., 90%, while the second part 82 may have a transmission of substantially 100%. More generally, it is advantageous to have one part having a very high and substantially 100% transmission, which will not block any significant amount of radiation, whereas the other part may have a significantly lower transmission, of any value between say 50% and 95%. This other part will actively serve to block radiation. A relatively high transmission allows that the area of the strip necessary for sufficiently reducing the intensity is large, especially when compared to non-transmissive strips, such as metal strips. This in turn ensures that the length of the strip which is located in the beam is large enough not to cause any symmetry problems in the distribution, since any effects of locally blocking radiation are smeared out over a relatively large area. Furthermore, it may be advantageous if the strips are wide enough to cover all rays of the beam that go to one and the same spot on a field plane. The width depends on numerical aperture of the illumination system, on the amount of defocusing, etc. All this allows the use of only one set of strips on one side of the beam, without causing ellipticity or telecentricity problems.

Since in many practical systems the width of the strips as preferred for the above reasons is rather large when compared to the dimensions of the beam, only a limited number of strips may be used, such as 12, again depending on the actual dimensions of the beam etc. To increase the number of possible corrections, it is advantageous to use two sets of strips, which are located opposite with respect to the beam, especially such that the strips in one set are positioned staggered with respect to the strips in the other set. This allows a correction by the strips of the one set intermediate positions of the strips of the second set.

The step-like part 85 is provided in order to prevent leakage of radiation through slits between adjacent strips. Since the step-like parts 85 of neighbouring slits are designed to overlap, no radiation will escape and influence the intensity. Of course, other ways of preventing radiation leakage are also possible, such as interpenetrating grooves etc.

Figure 13:
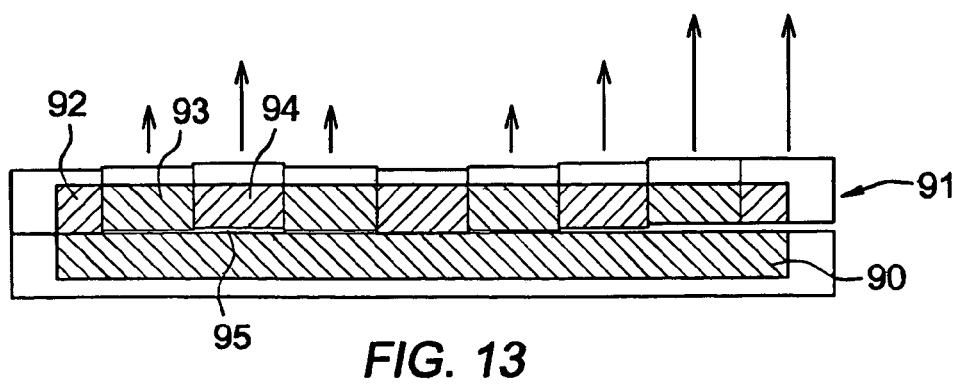
FIG. 13 diagrammatically illustrates an optical attenuator element according to a fifth embodiment of the illumination system according to the invention.

FIG. 13 diagrammatically illustrates an optical attenuator element according to a fifth embodiment of the illumination system according to the invention;

The optical attenuator element comprises a first mirror 90 and a composite second mirror 91, which comprises a number of partial mirrors 92, 93, 94. Between the second part mirrors and the first mirror is a slit 95.

Partial mirrors 92, etc., may be moved with respect to the first mirror 90 by mirror actuators (not shown) in a direction perpendicular to the slit 95 present between the first mirror and the second mirror, as indicated by the arrows. This slit may have a width which varies from one second part mirror to another, depending on the position of the partial mirrors. The local width of the slit 95 may be selected to allow a desired correction of the local intensity distribution. This is achieved by arranging the optical attenuator element comprising mirrors 90 and 91 in a beam, such that the part of the radiation reflected by the mirrors remains in the beam as directed towards a desired surface, while the part transmitted by the slit is taken out of the beam. This taking away radiation constitutes the influence on the intensity distribution. Note that it is possible to take away radiation from the center of the beam, when the slit 95 is located in the center of the beam, i.e., in an axis of symmetry, which is favourable in order to prevent telecentricity problems.

Although the embodiment shown comprises a one-piece first mirror 90, it is also possible to use a composite first mirror. This allows an even better symmetrical slit 95. The number of part mirrors for the first and second mirrors 90, 91, may be anything between 1 (one-piece mirror) and a large number of between 8 and up to 40. The complexity of the system will increase with the number of part mirrors, as will the flexibility thereof.

Figure 14:
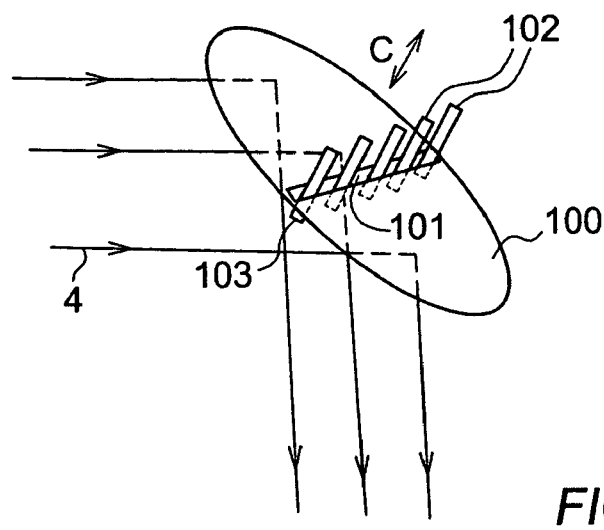
FIG. 14 illustrates diagrammatically a sixth embodiment of the illumination system according to the invention.

FIG. 14 illustrates diagrammatically a sixth embodiment of the illumination system according to the invention.

Herein, beam 4 is reflected by mirror 100, which has a slit 101, through which movable strips 102 project, which have an end face 103.

Mirror 100 may be any mirror already present in the apparatus, which is preferred in the case of EUV systems due to keeping extra reflection losses to a minimum, or may be an additional mirror, which possibly requires redirection of the beam 4. The mirror has a slit 101 in the center, or at least in a central part of the beam 4. Note that there may be more than one slit present.

A number of radiation blocking strips 102 is present in the slit 101. It is also possible to use separate holes or apertures for the individual strips, instead of one or more slits. The number of strips is not limited to the number depicted, but may vary between a low number such as one or two, and any high number up to say 50. A number of between 10 and 35 is preferred because this gives a good mix of flexibility in modifying the radiation of the beam 4 with limited complexity of the optical attenuator element.

The strips 102 are movable in a direction through the slit 101, by means of strip moving means (not shown). The strip moving means may be any suitable means, such as piezoelectric motors. Preferably, the strips are independently movable, and a preferred direction of movement is perpendicularly with respect to the plane of the mirror, as indicated by arrow C, although any other non-parallel direction would be allowed as well. A big advantage of this embodiment is that the strip moving means may be present on the side of the mirror 100 that faces away from the beam 4. This ensures that these do not influence the beam of radiation. Furthermore, they may be arranged at a location where space is available, i.e., away from crowded parts of the apparatus.

When the strips protrude through from the plane of the mirror 100, on the side where the beam 4 strikes the surface of the mirror, they will block a part of the radiation. The further the strips protrude through the plane, the more radiation is blocked. It is advantageous to keep the area of slit and/or apertures as small as possible. This ensures that, in case no blocking of radiation is desired, the remaining slit 101 (or apertures) takes away as little radiation as possible. Advantageously, each strip has an end face 103 which is capable of reflecting radiation. Then, in case no blocking action is required, the end faces 103 of the strips may be arranged flush with the surface of the mirror 100, preferably the end faces 103 and the mirror surface forming a continuous surface. This allows in principle 100% reflection of radiation.

Note that the term "strip" is meant to encompass any relatively narrow shape, which may comprise true strips, i.e., having a low thickness/width ratio, but also bars, rods etc., which are more easily provided with a reflective end face.

Figure 15:
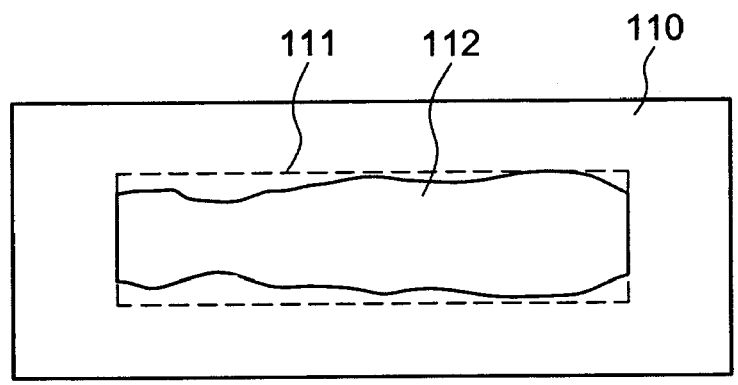
FIG. 15 shows an optical attenuator element of a seventh embodiment of the illumination system according to the invention.

FIG. 15 shows an optical attenuator element of a seventh embodiment of the illumination system according to the invention.

Herein, a quartz plate is denoted by 110, whereas 111 indicates an area irradiated by a beam of radiation, while 112 denotes a coating.

A quartz plate is covered with a coating, such as an blocking coating. A part of this coating is removed, except in a part 112, which then has a higher transmission for the radiation used. The part of the coating to be removed may be determined by measuring the intensity distribution without the optical attenuator element being present. Deviations from the desired intensity may then be transferred, either one-to-one when in focus or calculated from a convoluted projection on a position of the attenuator element, to the attenuator element as a width of coating to be removed. Care must be taken to ensure that the remaining part 112 is aligned with the area 111, corresponding to a projection of the beam of radiation onto the quartz plate. The edges of the remaining part 112 are constructed to block a desired part of the radiation. Thereto the remaining part 112 has rough edges, where the coating has been removed, the width of the removed part corresponding to the amount of radiation to be blocked (or absorbed). Preferably, the coating is removed in a symmetrical fashion with respect to a central line of the beam, to prevent telecentricity and ellipticity problems, as discussed above.

An alternative is to apply a blocking coating only in the center of the beam, the width of this coating again corresponding to the amount of radiation to be blocked.

Instead of removing coating it is also possible to cut out a foil with the desired profile or shape, and cover the quartz plate with the foil, or apply any other material in the desired pattern to the quartz plate. Next, the coating is applied to all of the surface. By subsequently removing the foil or other originally applied material, a part of the quartz plate will have remained free from coating. For better results it is possible to apply foil and coating to both sides of the plate.

Note that the plate need not be made of quartz. Any material which is transmissive for the radiation used is possible, such as ordinary glass for visible radiation, and some fluorites, as an alternative to quartz for deep UV applications.

The filter thus provided may be located in principle at any position, and preferably close to a field plane, within the beam. An advantage is that it is a thin optical attenuator element. It is possible to combine a number of equal or different filters in sets, thus allowing the intensity distribution of the beam to be changed in a simple and economical way.

Figure 16:
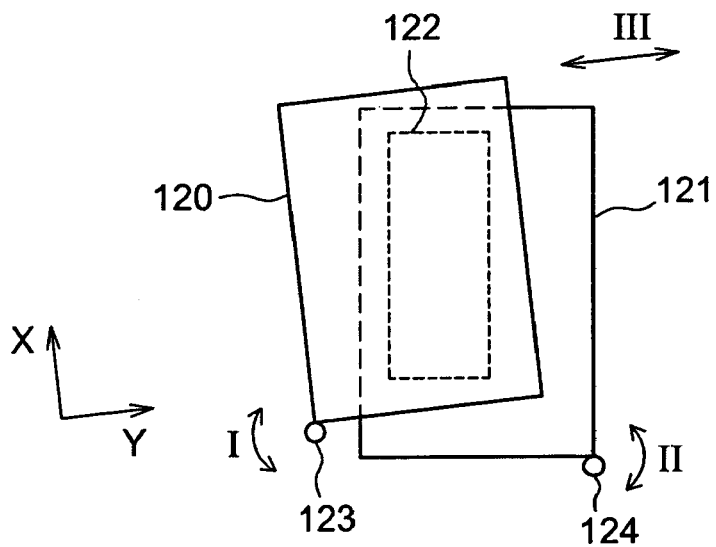
FIG. 16 diagrammatically shows a plan view of an optical attenuator element of an eighth embodiment of the illumination system according to the invention.

FIG. 16 diagrammatically shows a plan view of an optical attenuator element of an eighth embodiment of the illumination system according to the invention.

The attenuator element comprises a first plate 120, and a second plate 121, which are movable round a first axis 123, a second axis 124, as indicated by arrows I and II, respectively, and also movable with respect to each other along the direction of arrow III. A window 122 indicates the intended projection of a beam of radiation.

The plates 120 and 121 are transmissive filters, having an index of transmission which varies along, e.g., the length and/or width of the plates. Advantageously, the index of transmission of plate 120 will vary in a complementary sense to the variation of the index of transmission of plate 121. E.g., when the index of transmission of plate 120 increases (linearly or otherwise) when going from left to right in the drawing, then the index of transmission of plate 121 will decrease (again, linearly or otherwise) in the same direction. By providing the two plates in an overlapping fashion, such that the beam of radiation will pass both plates 120 and 121, as indicated by window 122 in the figure, both plates will attenuate the radiation. This may be used to correct an intensity distribution variation which is symmetrical, but also for example a distribution which has a "tilt," i.e., which is linearly increasing in a direction.

Figure 17:
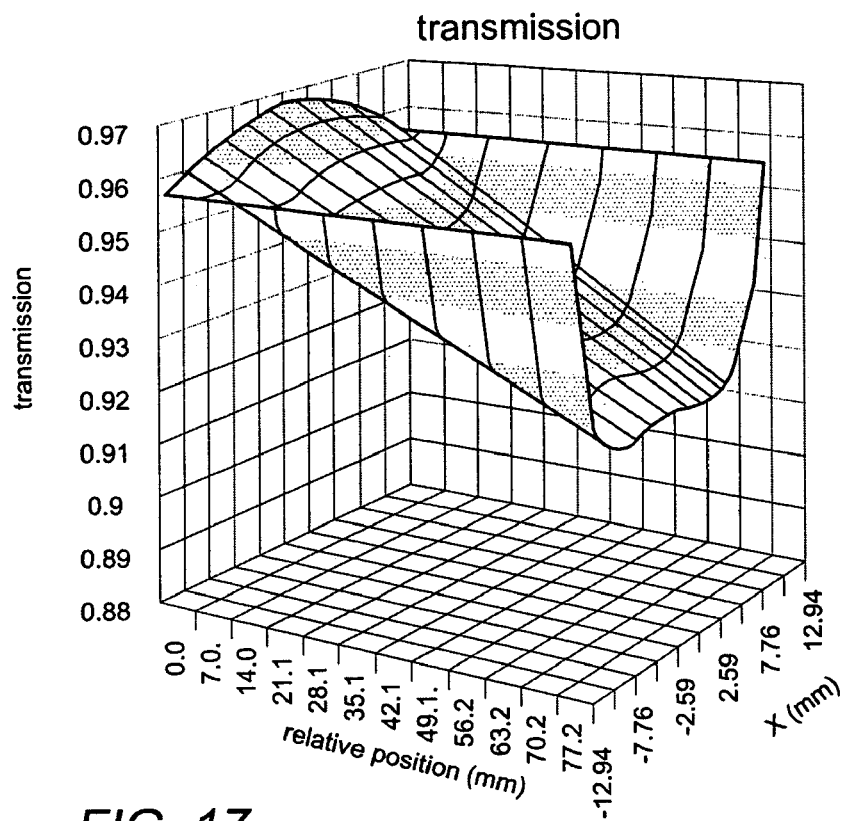
FIG. 17 shows a combined transmission profile of the optical attenuator element of FIG. 16.

E.g., one may provide two plates 120 and 121 with transmission coefficients which increase complementary to each other (see FIG. 17). By shifting the plates 120 and 121, in the y-direction, or shifting the plates 120 and 121 with respect to the beam (or window 122), the total transmission coefficient may be influenced, which may also serve to correct an intensity distribution which varies symmetrically in, say, x-direction. Note that it is not necessary that both plates have transmission coefficients which vary linearly, though at least a complementary variation may be used. Furthermore, by rotating one plate or both plates, round the corresponding axis 123 or 124, it is possible to create a total transmission coefficient which may correct an intensity distribution which varies in, for example, the x-direction.

FIG. 17 shows a combined transmission of the optical attenuator element of FIG. 16 as a function of position, or displacement, of one filter with respect to the other. As discussed above, the transmission coefficient shows the possibility of correcting an intensity distribution which shows a deviation which is symmetrical in the x-direction. A "tilt" in the intensity distribution may be corrected by rotating and shifting the plates such that the combined transmission along the length of the two filters is represented by the line 125 in FIG. 17.

Figure 18:
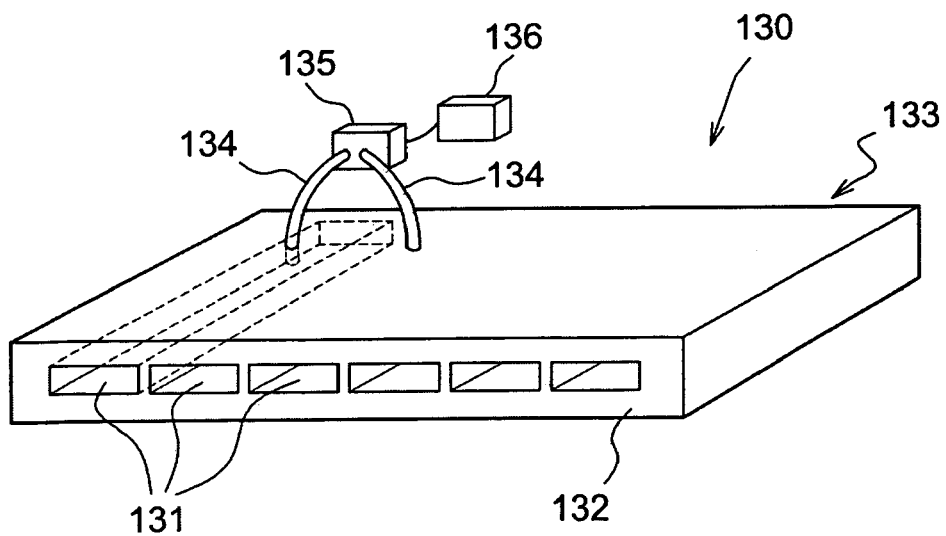
FIG. 18 shows a perspective view of an optical attenuator element according to a ninth embodiment of the illumination system according to the invention.

FIG. 18 shows a diagrammatical perspective view of an optical attenuator element according to a ninth embodiment of the illumination system according to the invention.

Herein, 130 is a transparent body, having a number of channel 131 therein, running from a front face 132 to a back face 133. Ducts 134 connect the channels to a medium supply 135, which is connected to a medium supply control means 136.

For clarity's sake, only two ducts 134 are shown, where in reality every channel 131 may be provided with a duct 134.

The body 130 is made of a material which is sufficiently transparent for the radiation to be used. In most cases, e.g., quartz will have sufficient transmission, but in other cases certain types of glass or plastics will satisfy the requirements.

The channels 131 in the body 130 are shown to run from front face 132 to back face 133. They may be open channels but also sealable channels, in which latter case the channels could also be called cavities within body 130. The shape of the channels 131 is not particularly limited, and could have, e.g., a circular cross-section. However, in many cases a more or less rectangular shape of the channels 131 will be satisfactory. In order to be able to influence as large an area as possible, it is advantageous to have as little material of the body 130 between adjacent channels 131 as possible. The channels 131 may be present over all of the body 130, but also only in a desired part of the body, such as a central part with respect to a beam of radiation that is to pass through the body. The width of the channels may depend on the dimensions of the beam to be influenced. Often a beam width of between 10 mm and 200 mm is used, although others are not excluded. In those cases a channel width of between 0.5 mm and 10 mm ensures a reasonable number of channels of between 5 and 150, whereas a number between about 8 and about 50 offer still very good possibilities of influencing the beam, while limiting the complexity. The channel height may be selected according the media to be used. A height of a few tenth of a millimeter will normally suffice.

A well known type of supply and supply controller are printer heads and ink cartridges for printers, in particular ink jet printers. These comprise nozzles and technology to control ink flow therethrough. Such printer heads and cartridges and the technology on which these are based, may be used advantageously.

One or more of the channels may be filled with a medium, i.e., a liquid, a gas, at low or high pressure. The medium is present in order to be able to modify the transmission of the attenuator element as a whole, because the medium may be more absorptive than the material of the body 130, or in some cases less absorptive. Examples are water with an ink or some colorant, or gases which absorb at least some of the radiation. Water is a medium which is transparent down to very short wave radiation, and is e.g., reasonably transparent down to 190 nm. Other liquids and gases may also be used, e.g., various oils.

The medium may be present permanently or temporarily. It is possible to supply medium to the channels 131 by means of the ducts 134 and the medium supplies 135, which supplying is controlled by the medium supply control means 136, e.g., a microcomputer. This supplying may be performed as a one-time action, in that the channels, or cavities, are constantly filled with one and the same type of medium. It is also possible to vary the supply of medium and/or its transmission properties in dependence of requirements, e.g., in case the intensity distribution varies in time. It is then possible to provide a flow of medium through a channel 131, wherein medium may be drained either at an opening in the front face 132 or the end face 133, or through the duct 134, or alternatively through an additional drainage duct (not shown). This allows continuous freshening or changing of the amount of medium, and e.g. a concentration of absorptive components therein, ensuring a dynamic control over transmission properties. This may be performed independently for each individual channel or cavity. After a certain medium has fulfilled its function, it may be substituted by a new medium, by flushing the channels or cavities 131, and supplying the new medium.

Figure 12:
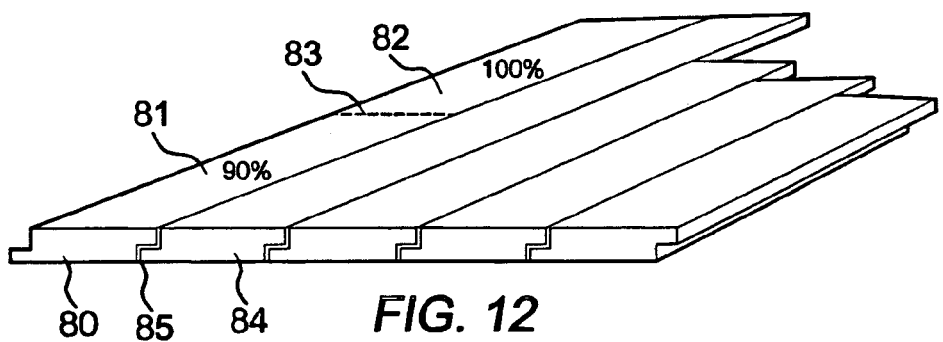
FIG. 12 illustrates an alternative embodiment of a detail of FIG. 11.
Figure 20A:
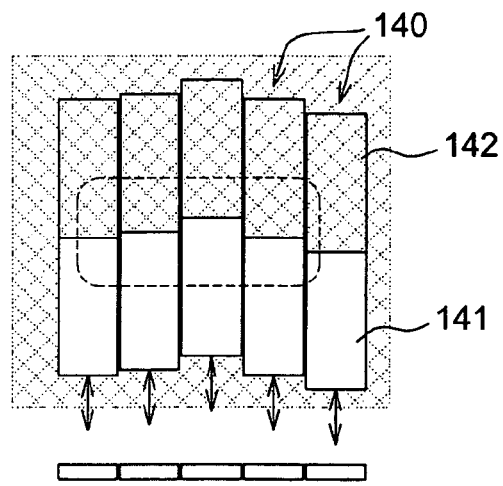
FIGS. 20a-c show three alternative embodiments to FIG. 12.
Figure 20B:
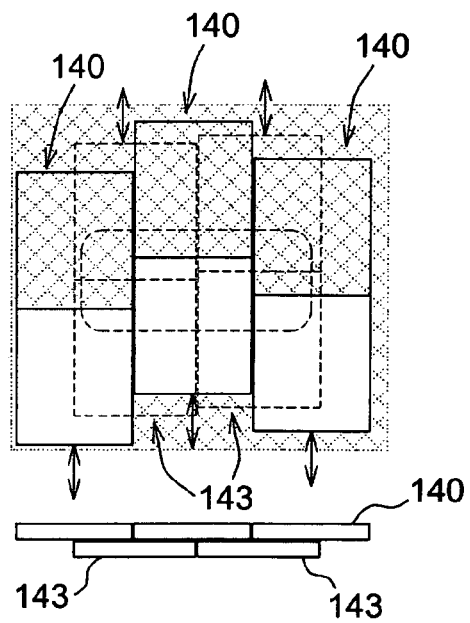
Figure 20C:
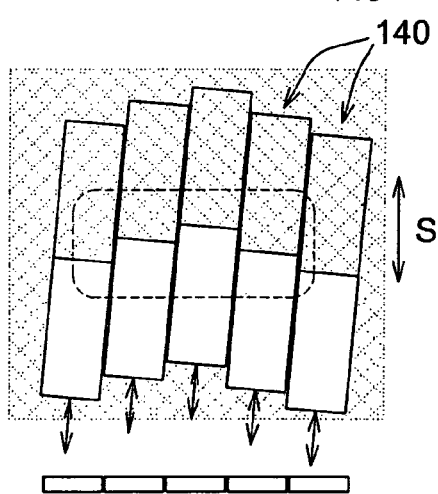

FIG. 20a-c show alternative embodiments to FIG. 12.

FIG. 20a shows a plan view and a side view of an optical attenuator device having 5 elements 140 that are movable in the direction of the arrows. Each element 140 has a part 141 with a substantially 100% transmission, and a part 142 with a transmission of say 90%. A cross-section of a beam of radiation is indicated with a dashed line.

Due to the high transmission, the dimensions of the elements 140 should be large enough to still be able to correct up to some 1.5%, and sometimes up to 10% of the intensity. However, because the elements are large enough to cover all rays going towards a single point on the level of the surface to be illuminated, e.g., the patterning device, there is no ellipticity. And because of the low influence on the edge of the beam (only 10% absorption), telecentricity problems are small.

The side views shows the five elements 140, where slits between the elements may leak light therebetween.

FIG. 20b shows a double-sided version of the embodiment of FIG. 20a, wherein the elements 140 (only three are shown) are overlapped by a second set of elements 143, that are also movable, in the direction of the arrows as shown. The elements 143 of the second set and the elements 140 of the first set have their less transmitting part at opposite sides. This ensures that a symmetrical attenuator device is obtained, thus further removing telecentricity risks. Furthermore, the elements are shown to overlap, thus decreasing leaking of light between elements. Furthermore, the elements are shown with a larger width, in order to end up with the same number of elements, to not increase complexity. The space available for actuators (not shown) of the elements thus also increases. Alternatively, the width of the element may be selected to be the same as in the embodiment of FIG. 20a, allowing a more precise correction of the intensity.

FIG. 20c shows another embodiment to decrease the possible influence of light leaks due to slits between elements. Here, the elements 140 are tilted with respect to a scanning direction S of the lithographic apparatus in which this embodiment may be used. The scanning direction is in the vertical of the drawing. Since the elements and thus the slits are tilted, any light leaking through a slit will be spread out in the non-scanning direction.

Although not shown, it is also possible to provide a second set of elements, also tilted, but in a direction that is mirrored with respect to the scanning direction. This provides both overlapping of elements, a symmetrical attenuator device preventing telecentricity, and any light leaking through slits between elements is furthermore smeared out. As such this embodiment provides optimum results.

While specific embodiments of the invention have been described above, it will be appreciated that the invention may be practised otherwise than as described. In particular, it is possible to use any technically possible combination of illumination systems and/or optical attenuator elements therefor, such as two bodies with medium-filled channels, which bodies are rotatable with respect to each other. Such a combination would offer the possibilities of both the embodiment discussed in connection with FIG. 16 and the embodiment discussed in respect of FIG. 18. The description is not intended to limit the invention.

What is claimed is:

1. An optical attenuator device for improving a homogeneity of a beam of radiation for use in a lithographic apparatus, said optical attenuator device comprising at least one optical attenuator element which removes at least a part of said radiation from said beam of radiation, wherein the at least one optical attenuator element comprises at least two sheets having edges, said sheets being connected to each other at a common edge and at least one of said sheets being movable with respect to another of said sheets, around an axis formed by said common edge.

2. The optical attenuator device according to claim 1, wherein the at least one optical attenuator element is movable such that a cross-sectional area as presented to the beam is modifiable while a 3-dimensional shape of said optical attenuator element remains mirror symmetrical with respect to a line parallel to a propagation direction of the beam of radiation.

3. The optical attenuator device according to claim 1, comprising an actuator constructed and arranged to move said at least one of said sheets with respect to said another of said sheets, around said axis.

4. The optical attenuator device according to claim 3, wherein said at least two sheets comprise an electrically conducting material, and wherein said actuator comprises an electrical source connected to said electrically conducting material, constructed and arranged to charge said electrically conducting material.

5. The optical attenuator device according to claim 4, wherein said at least two sheets are suspended by electrically conducting wires which connect the electrically conducting material to the source.

6. The optical attenuator device according to claim 1, wherein the at least one optical attenuator element comprises one of a ribbon and a wire having a width profile which varies over its length.

7. The optical attenuator device according to claim 6, wherein the optical attenuator element has a length which is at least two times as long as a portion thereof which is present in the beam of radiation, and wherein said optical attenuator element is movable with respect to the beam by means of an actuator respectively.

8. The optical attenuator device according to claim 6, wherein said optical attenuator element is wound on two reels, said optical attenuator device further comprising a reel drive for moving the optical attenuator element with respect to the beam.

9. The optical attenuator device according to claim 1, wherein said optical attenuator element comprises an optical filter element having an optical density which varies as a function of position along a length of the optical filter element, wherein the optical filter element is rotatable with respect to the beam of radiation.

10. The optical attenuator device according to claim 1, wherein said at least one optical attenuator element comprises at least two optical filter elements, each having an optical density which varies as a function of position along a length of the optical filter element, at least one of said optical filter elements being rotatable with respect to another of said filter elements.

11. The optical attenuator device according to claim 10, comprising a first optical filter element, having an optical density which varies as a first function of position along a length of the first optical filter element, and a second optical filter element, having an optical density which varies as a second function of position along a length of the second optical filter element, wherein the first function is substantially a reciprocal of the second function.

12. The optical attenuator device according to claim 1, wherein the at least one optical attenuator element comprises a mirror and at least one radiation blocking element which is movable through an opening in said mirror.

13. The optical attenuator device according to claim 1, wherein said at least one optical attenuator element comprises a filter which comprises a substrate of a material which is transparent for said radiation, and a coating on said substrate, wherein said coating comprises at least one of an anti-reflection coating and an absorptive coating, wherein only on a part of said substrate said coating is present, said part having a length in a longitudinal direction and a width that varies over the length.

14. The optical attenuator device according to claim 13, wherein said width varies as a function of position in said longitudinal direction, which function corresponds to a reciprocal of an integrated intensity of the beam of radiation, as integrated in a direction perpendicular to said longitudinal direction and as measured at substrate level without said optical attenuator device in place.

15. The optical attenuator device according to claim 13, wherein said part has an axis of symmetry in the longitudinal direction.

16. An optical attenuator device for improving a homogeneity of a beam of radiation for use in a lithographic apparatus, said optical attenuator device comprising at least one optical attenuator element which removes at least a part of said radiation from said beam of radiation, wherein said at least one optical attenuator element comprises a first mirror and a second mirror and a mirror actuator, wherein a slit is present between said first and second mirror, wherein at least one of mirror is movable with respect to the beam of radiation by the mirror actuator, so as to vary the slit width.

17. The optical attenuator device according to claim 16, wherein the slit is located in a central part of said beam.

18. The optical attenuator device according to claim 16, wherein at least one of said first mirror and said second mirror comprises a plurality of mirror segments, which are movable with respect to the beam of radiation.

19. The optical attenuator device according to claim 1, wherein the at least one optical attenuator element comprises at least one optical filter element which comprises a body that has at least one channel therein and is made of a material which is transparent to said radiation, wherein the channel is fillable with a medium.

20. The optical attenuator device according to claim 19, wherein the optical attenuator device further comprises an injector to controllably fill said at least one channel.

21. The optical attenuator device according to claim 20, wherein said injector is constructed and arranged to fill the at least one channel with a controllable amount of a material having a higher specific absorption for the radiation than the medium.

22. An optical attenuator device for improving a homogeneity of a beam of radiation for use in a lithographic apparatus, said optical attenuator device comprising at least one optical attenuator element which removes at least a part of said radiation from said beam of radiation, wherein said at least one optical attenuator element comprises a plurality of mutually parallel strips which are movable into the beam of radiation and which comprise a material which is between 10% and 100% transparent for said radiation.

23. The optical attenuator device according to claim 22, wherein the strips comprise a material which is between about 80% and about 100% transparent for said radiation.

24. The optical attenuator device according to claim 22, further comprising an actuator constructed and arranged to move said strips with respect to said beam.

25. The optical attenuator device according to claim 22, wherein said optical attenuator device comprises a first plurality of mutually parallel strips which are movable into the beam of radiation from a first side thereof, and a second plurality of mutually parallel strips which are movable into the beam of radiation from a second side opposite the first side.

26. The optical attenuator device according to claim 25, wherein the strips of the first plurality of strips are movable in a first plane, and the strips of the second plurality of strips are movable in a second plane that is parallel to and non-coplanar with the first plane.

27. The optical attenuator device according to claim 22, wherein at least one strip is movable into a position in which said at least one strip partly overlaps at least one other strip.

28. The optical attenuator device according to claim 25, wherein an axis of symmetry of at least one strip of said first plurality of strips is displaced with respect to a corresponding axis of symmetry of at least one strip of said second plurality of strips.

29. The optical attenuator device according to claim 28, wherein said axis of symmetry of at least one strip of said first plurality of strips is displaced with respect to a corresponding axis of symmetry of at least one strip of said second plurality of strips by half a width of said at least one strip of the first plurality of strips.

30. The optical attenuator device according to claim 25, wherein the strips of the first plurality of strips extend in a first direction, and wherein the strips of the second plurality of strips extend in a second direction that is non-parallel with the first direction.

31. A filter, comprising:
a substrate having a surface; and
an anti-reflection coating, wherein said anti-reflection coating is present on a central part of the filter, said central part of the filter extending in a longitudinal direction from one edge of the filter to an opposite edge of the filter and having a length in said longitudinal direction and a width in a direction perpendicular to the longitudinal direction, wherein said width vanes over said length, said central part of the filter having a homogeneous transmission of at least 90% for a predetermined type of radiation, wherein a transmission of said central part of the filter is greater than other parts of the filter.

32. The filter according to claim 31, wherein the transmission of the remaining part is substantially homogeneous.

33. The filter according to claim 31, wherein said central part of the filter has a homogeneous transmission of at least 98% for the predetermined type of radiation, wherein said other parts have a substantially homogeneous transmission that is lower than the transmission of said central part of the filter.

34. The filter according to claim 31, wherein the central part of the filter has a shape with an axis of symmetry parallel to said longitudinal direction.

35. A method for manufacturing a filter comprising:
providing a substrate having a surface and having a transmission of at least 90% for a predetermined type of radiation;
applying a removable material on a portion of the surface, such that a central part of the filter is kept free from said removable material, wherein said central part of the filter extends in a longitudinal direction from one edge of the substrate to an opposite edge of the substrate and having a length in said longitudinal direction and a width in a direction perpendicular to the longitudinal direction, wherein said width varies over said length as a predetermined function of position along said length;
applying an anti-reflection coating over both the removable material and another part of the surface; and
removing the removable material together with the anti-reflection coating that has been applied over said removable material.

36. A radiation system constructed and arranged to provide a beam of radiation with a homogeneous intensity distribution, comprising a source of radiation, a collector constructed and arranged to collect said radiation into the beam of radiation, an optical attenuator device comprising at least one optical attenuator element which removes at least a part of said radiation from said beam of radiation, and a mirror comprising a plurality of facets that are arranged in the beam of radiation, each facet constructed and arranged to reflect a part of the beam of radiation as a reflected partial beam, such that at least two of said reflected partial beams overlap at a predetermined distance from the mirror, wherein the optical attenuator element comprises at least one rod located between the collector and the mirror, wherein the rod extends in a direction perpendicular to the propagation direction of the beam of radiation.

37. The radiation system according to claim 36, wherein the at least one rod is rotatable around an axis which extends substantially parallel to the propagation direction of the beam of radiation and which intersects the rod.

38. The radiation system according to claim 36, wherein the at least one rod has a cross-sectional profile that varies over a length of the rod.

39. The radiation system according to claim 36, wherein the at least one rod that has a cross-sectional profile that varies over a length of the rod is rotatable around an axis that extends through the rod parallel to the direction of the length.

40. The radiation system according to claim 36, wherein the at least one rod is expandable to locally vary its effective cross-sectional area with respect to the beam of radiation.

41. The radiation system according to claim 36, comprising at least two rods that enclose an angle between each other.

42. A lithographic apparatus comprising:
a radiation system according to claim 36, to provide a projection beam of radiation;
a support structure to support a patterning device, the patterning device serving to impart the projection beam with a pattern in its cross-section;
a substrate table to hold a substrate; and
a projection system to project the patterned beam onto a target portion of the substrate.

43. The lithographic apparatus according to claim 42, wherein said patterning device and substrate table are movable with respect to the beam of radiation in a scanning direction, said beam of radiation being incident on the patterning device on an incidence area, wherein the at least one optical attenuator element is present in a part of the beam corresponding to a central part of said incidence area.

44. A lithographic apparatus comprising:
a beam receptor constructed and arranged for receiving a beam of radiation;
an optical attenuator device for improving a homogeneity of the beam of radiation which is located in the beam of radiation, said optical attenuator device comprising at least one optical attenuator element which removes at least a part of said radiation from said beam of radiation, which is located in the beam of radiation, the at least one optical attenuator element comprising at least two sheets having edges, said sheet being connected to each other at a common edge and at least one of said sheets being movable with respect to another of said sheets, around an axis formed by said common edge;
a support structure for supporting a patterning device, the patterning device serving to impart the homogeneous projection beam with a pattern in its cross-section, thus providing a patterned beam;
a substrate table for holding a substrate; and
a projection system to project the patterned beam onto a target portion of the substrate.

45. The lithographic apparatus according to claim 44, wherein said patterning device and substrate table are movable with respect to the beam of radiation in a scanning direction, said beam of radiation being incident on the patterning device on an incidence area, wherein the at least one optical attenuator element is present in a part of the beam corresponding to said incidence area.

46. A device manufacturing method comprising:
producing a projection beam of radiation using a radiation system constructed and arranged to provide a beam of radiation with a homogeneous intensity distribution, comprising a source of radiation, a collector constructed and arranged to collect said radiation into the beam of radiation, and an optical attenuator device comprising at least one optical attenuator element which removes at least a part of said radiation from said beam of radiation, the at least one optical attenuator element comprising at least two sheets having edges, said sheets being connected to each other at a common edge and at least one of said sheets being movable with respect to another of said sheets, around an axis formed by said common edge;
patterning the projection beam with a pattern in its cross-section; and
projecting the patterned beam of radiation onto a target portion of a substrate.

47. An optical attenuator for use in a lithographic apparatus comprising:
an attenuator element disposable in a radiation beam path of the lithographic apparatus, such that the attenuator element extends along a narrow, central region of the beam path, the attenuator element comprising a material having a transmissivity of less than 100% at a wavelength of radiation of the lithographic apparatus.

* * * * *

UNITED STATES PATENT AND TRADEMARK OFFICE
CERTIFICATE OF CORRECTION

PATENT NO.         : 7,030,958 B2                                            Page 1 of 1
APPLICATION NO.    : 10/748849
DATED              : April 18, 2006
INVENTOR(S)        : Luijkx et al.

It is certified that error appears in the above-identified patent and that said Letters Patent is hereby corrected as shown below:

In the Claims:

Col. 34, Claim 3, line 2, the word -- further -- should be added before the word "comprising"

Col. 35, line 65: Claim 27, line 1, the number "22" should read -- 26 --

Col.36, line 25: Claim 31, line 9, the word "vanes" should read -- varies --

Col. 38, line 3: Claim 44, line 11, the phrase "said sheet" should read -- said sheets--

Signed and Sealed this

Nineteenth Day of September, 2006

JON W. DUDAS
*Director of the United States Patent and Trademark Office*